United States Patent [19]

Kiyokawa et al.

[11] Patent Number: 5,289,263
[45] Date of Patent: Feb. 22, 1994

[54] APPARATUS FOR EXPOSING PERIPHERY OF AN OBJECT

[75] Inventors: Shinji Kiyokawa; Nobutoshi Orgami; Takeshi Takada; Kenji Kamei, all of Kyoto, Japan

[73] Assignee: Dainippon Screen Mfg. Co., Ltd., Japan

[21] Appl. No.: 4,788

[22] Filed: Jan. 14, 1993

Related U.S. Application Data

[63] Continuation of Ser. No. 512,991, Apr. 24, 1990, abandoned.

[30] Foreign Application Priority Data

| Apr. 28, 1989 | [JP] | Japan | 1-109291 |
| Jun. 9, 1989 | [JP] | Japan | 1-147174 |
| Aug. 14, 1989 | [JP] | Japan | 1-209850 |

[51] Int. Cl.$^5$ .................... G01B 11/14; G03B 27/42
[52] U.S. Cl. .................... 356/375; 356/400; 355/53
[58] Field of Search .................... 356/375, 400; 355/53

[56] References Cited

U.S. PATENT DOCUMENTS

| 4,752,898 | 6/1988 | Koenig | 356/400 |
| 4,907,035 | 4/1990 | Galburt et al. | 356/400 |
| 4,910,549 | 3/1990 | Sugita | 355/53 |
| 5,028,955 | 7/1991 | Hayashida et al. | 355/53 |

FOREIGN PATENT DOCUMENTS 1-187822 7/1989 Japan.

*Primary Examiner*—Richard A. Rosenberger
*Assistant Examiner*—K. P. Hantis
*Attorney, Agent, or Firm*—Ostrolenk, Faber, Gerb & Soffen

[57] ABSTRACT

A periphery exposing apparatus for exposing a periphery of a wafer having a curved circumferential peripheral portion and a linear portion comprises a spin chuck for rotatably supporting the wafer, a light source disposed above the spin chuck for exposing the wafer periphery, and a detector for detecting the line or portion. When the linear portion is being exposed, the light source is moved along the linear portion, rather than circularly around the periphery.

18 Claims, 17 Drawing Sheets

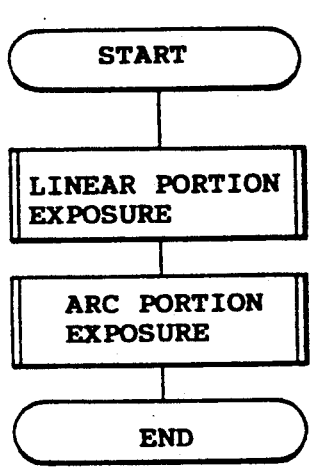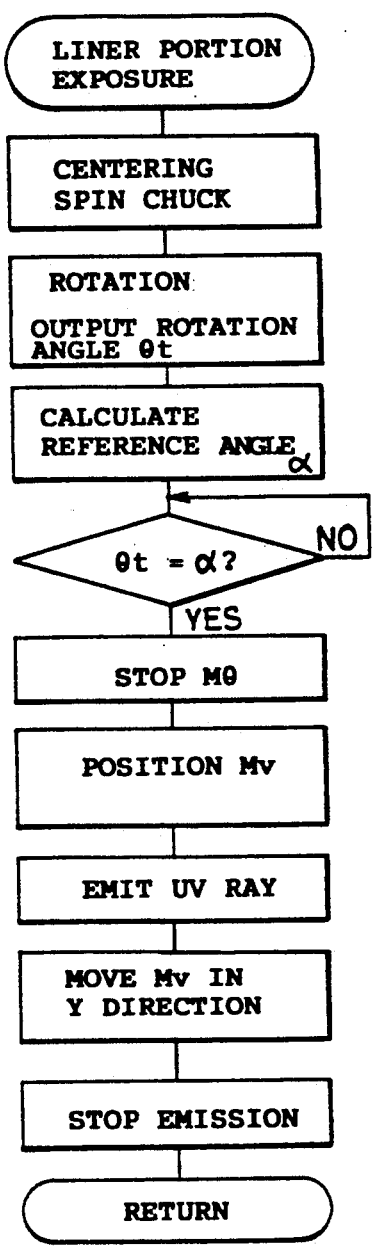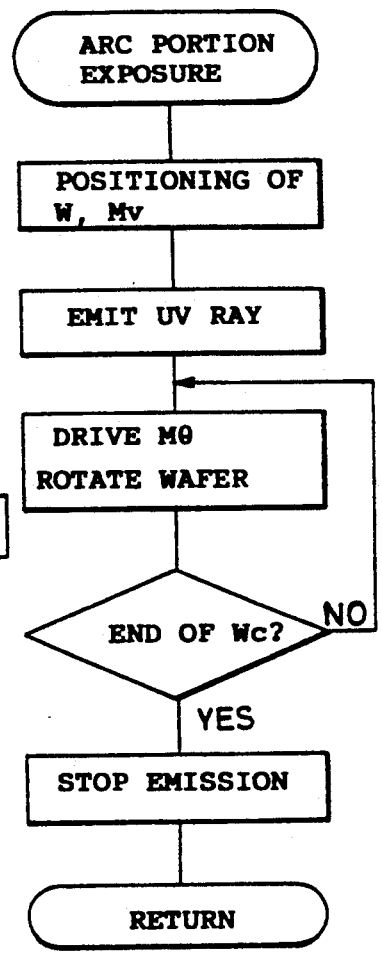

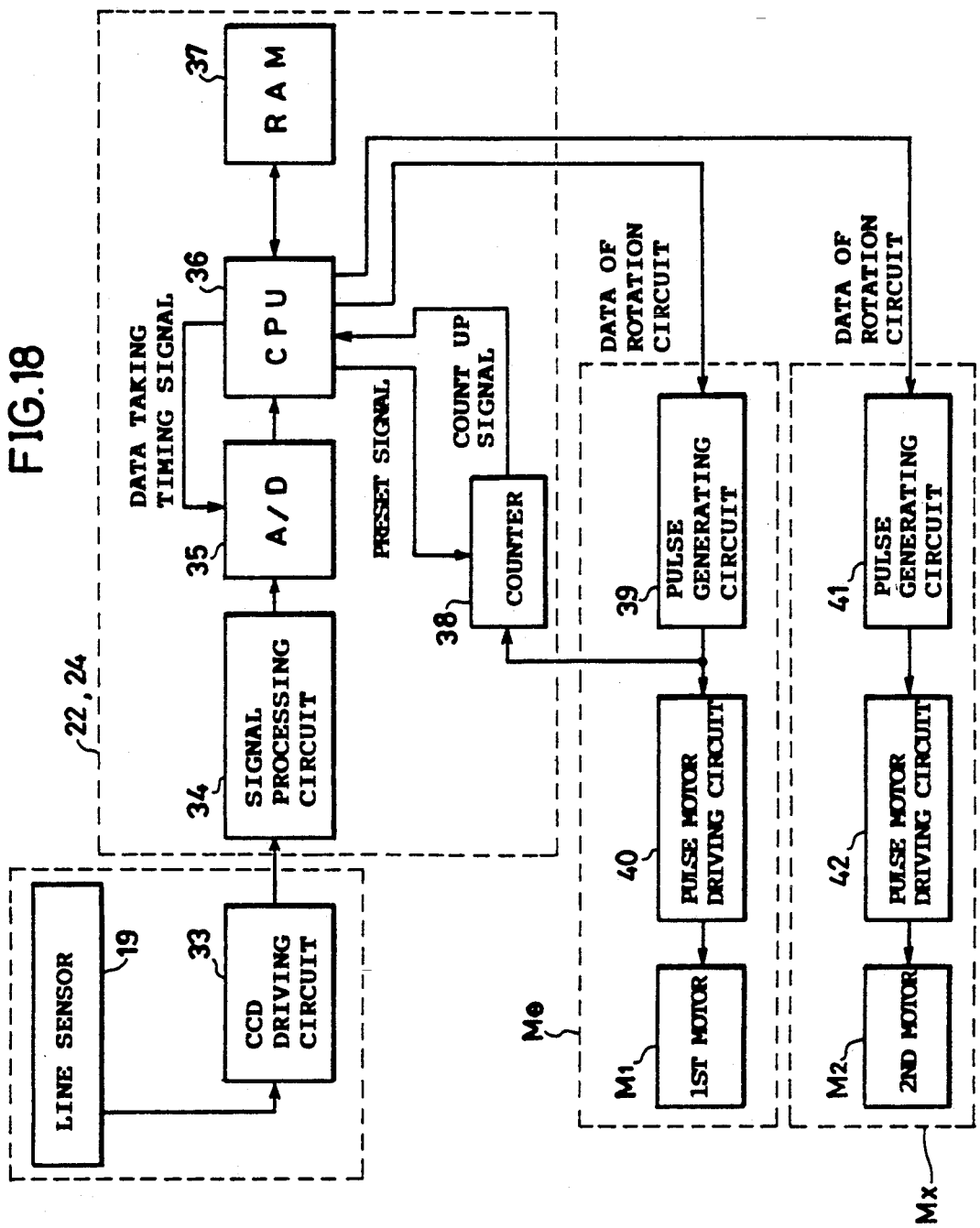

APPARATUS FOR EXPOSING PERIPHERY OF AN OBJECT

This is a continuation of application Ser. No. 07/512,991, filed on Apr. 24, 1990, now abandoned.

BACKGROUND OF THE INVENTION

1. Field of the Invention

The present invention relates to an apparatus for exposing peripheral portions of objects such as semiconductor wafers and, more specifically, to an apparatus for exposing the periphery of an object to remove photoresist applied on the periphery of the object.

2. Description of the Related Art

Recently, positive resist is being applied to a surface of a semiconductor wafer, a ceramic wafer or the like. The resist on the periphery of the wafer is removed by exposing the periphery of the wafer before or after exposing the desired patterns.

FIG. 1B is a side view of a conventional apparatus for exposing the periphery of a wafer and FIG. 1A is a plan view taken from the portion IA-IA of the apparatus for exposing the periphery of the wafer shown in FIG. 1B. Referring to FIGS. 1A and 1B, the conventional apparatus for exposing the periphery of a wafer comprises a table 11 for supporting a wafer W, a first motor M1 for rotating the table 11, and an illuminating apparatus Mv for exposing from above the periphery of the wafer W placed on the table 11. Referring to FIGS. 1A and 1B, the conventional apparatus for exposing periphery of a wafer has the below described structure. One illuminating apparatus Mv is provided spaced apart by a prescribed distance from the center of the wafer W, and the wafer W is rotated by the first motor M1, so that the periphery of the wafer is exposed. The periphery of the wafer W comprises an arc portion and a linear portion called an orientation flat. Exposure of the wafer periphery is carried out for the entire peripheral portion including the arc and the orientation flat portion.

When the wafer W is exposed by the conventional apparatus for exposing the periphery of the wafer, the arc portion can be exposed. However, at the linear portion, the distance of which from the center of the wafer W is shorter than that of the arc portion, the illuminating light illuminates outside the wafer. Therefore, the linear portion can not be exposed.

Therefore, the exposure of the linear portion has been carried out in the following manner.

(1) A plate cam having similar shape as the wafer W and which rotates in synchronization with the wafer W is provided, and a cam follower provided on the illuminating apparatus Mv is moved along the profile of the plate cam, so as to expose the linear portion by approximately the same width as the arc portion (plate cam method).

(2) Means for mechanically or optically detecting a wafer end portion (boundary between the arc portion and the linear portion) is provided. The detecting means detects the wafer end portion, and when the exposure portion moves from the arc to the linear portion, the wafer W is rotated with the distance from the center of the wafer W to the illuminating apparatus Mv adjusted so that the position of illumination by the illuminating apparatus Mv goes along the linear portion. Consequently, the linear portion can be exposed by approximately the same width as the arc portion (end portion detecting method).

The basic idea of the conventional methods is as follows. Namely, both the arc portion and the linear portion are exposed and the width of exposure of the arc portion and the linear portion are made approximately the same, with the wafer rotating at a constant speed. The conventional methods based on this idea have the following disadvantages.

(1) The illuminating apparatus Mv exposes a constant width from the outer periphery of the wafer W toward the center thereof. Therefore, referring to FIG. 2A, when the illuminating apparatus Mv illuminates the wafer end portions F1 and F2, the width of exposure L1 near the wafer end portions F1 and F2 becomes smaller than the width of exposure L0 of other portions, since the wafer end portions F1 and F2 have convex shape. This phenomenon becomes more conspicuous at the wafer linear portion Ws, and therefore, exposure by the same width can not be realized at the linear portion Ws.

(2) From the same reason as described above (1), when the illuminating apparatus Mv illuminates the wafer end portion F2 as shown in FIG. 2B, the length of exposure l1 in the inner side and the length of exposure l2 at the outer portion is very much different from each other (l1<l2) in the same period of time. Since the length of exposure at respective points in the width direction shown by a in FIG. 2B are different from each other, the amount of exposure per unit area in the same period of time becomes different. Consequently, uniform exposure can not be realized.

(3) When the resist is applied on the surface of the wafer W, the wafer W is rotated in the direction shown by the arrow of FIG. 3. As shown in the figure, the resist tends to be collected on the end portion on the upstream side of the direction of rotation of the wafer. Consequently, the resist becomes thick in this region Wa (see hatched portion in the figure). Since the exposure is done with the wafer W rotated at a constant speed, the resist can not be sufficiently removed in this thick region Wa.

When the speed of rotation of the wafer W is made sufficiently slow in order to surely remove the resist of the thick region Wa, the amount of exposure is increased. However since, the total processing speed is reduced, the throughput is also reduced.

(4) The width of the thick region Wa (portion represented by b in FIG. 3) described above (3) generally becomes larger than the uniform width L0 of exposure. However, the width L0 of exposure is constant, the resist outside the exposure width L0 can not be removed, even if the thick region Wa should be entirely exposed.

(5) When the chip size is large, the pattern region P by the step exposure is considerably distant from the linear portion Ws as shown in FIG. 4. Unnecessary resist must be removed over regions as wide as possible from the linear portion Ws to the portion represented by the two dotted line. However, if the width of exposure L0 is constant in the arc portion Wc and in the linear portion Ws, the resist which is not in the exposure width L0 remains as it is.

(6) When the wafer W is treated in the succeeding processes, prescribed portions of the wafer W are gripped by clamping pawls k as shown in FIG. 5. In order to provide stable clamping, the regions Wk to be clamped must be exposed by the width larger than the uniform exposure width L0. The reason for this is that when the clamp region Wk is exposed by the uniform width L0, the resist at the portions to be clamped is not exposed, therefore the resist peels when it is gripped by the pawl k.

SUMMARY OF THE INVENTION

Therefore, one object of the present invention is to provide an apparatus for exposing the periphery of an object with desired light intensity.

Another object of the present invention is to provide an apparatus for exposing linear the periphery of an object by a desired width.

A further, object of the present invention is to change the length of exposure from the periphery, dependent on the position of the periphery in an apparatus for exposing a periphery of an object.

A still further object of the present invention is to change the intensity of exposure of the periphery dependent on the positions of the periphery in an apparatus for exposing a periphery of an object.

A still further object of the present invention is to provide an apparatus for easily detecting a linear portion of an object having at least a linear portion.

A still further object of the present invention is to provide a method of exposure capable of exposing a periphery with desired light intensity.

The above described objects of the present invention can be attained by an apparatus for exposing a periphery of an object having at least a linear portion of the present invention, comprising: a supporting apparatus for rotatably supporting the object; an illuminating apparatus for emitting light to expose the periphery provided at a prescribed position opposed to the supporting apparatus; an exposure position detecting apparatus for detecting exposure position on the periphery of the object; and a controlling apparatus for controlling the supporting apparatus and the illuminating apparatus such that exposure is carried out under prescribed conditions of exposure including amount of exposure and width of exposure, dependent on the detected position of exposure.

In the present invention, the amount of exposure is set dependent on positions of the object, and the controlling apparatus controls the supporting apparatus such the, respective positions are exposed by the set amounts of exposure. Consequently, a desired position on the periphery can be exposed with desired light intensity.

Preferably, the exposure portion detecting apparatus includes a linear portion detecting apparatus for detecting the linear portion, and when the linear portion is to be exposed, the controlling apparatus controls the illuminating apparatus such that the illuminating apparatus moves relatively along the line.

Consequently, the width of exposure becomes constant over the entire length of the linear portion.

In accordance with another aspect of the present invention, a method for exposing an object having a periphery consisting of a linear portion and an arc portion comprises the steps of: supporting the object on an rotatable support base; preparing a light source having desired light intensity at a prescribed position opposed to the supporting base; and when the linear portion is to be exposed, moving the light source along the line.

When the linear portion is to be exposed, the light source having the desired light intensity is moved along the line. Consequently, a method of exposing the periphery in which the linear portion can be exposed by the same width can be provided.

In accordance with a still further aspect of the present invention, a linear portion detecting apparatus for detecting a linear portion of an object having a periphery with at least a linear portion and an arc portion includes: a supporting apparatus for supporting the object; a rotating apparatus for rotating the supporting apparatus by a prescribed angle; a positional data detecting apparatus provided at a prescribed position near the supporting apparatus for detecting positional data from the center of rotation of the supporting apparatus of the periphery of the object at every prescribed angle; and a calculating apparatus for calculating the position of the linear portion based on the maximum value of the positional data detected by the positional data detecting apparatus and on positional data of two points sandwiching the maximum value.

Positional data of the periphery from the center of rotation of the supporting portions are calculated at every prescribed angle, and the position of the linear portion is specified by a calculation based on the maximum value of the positional data and on positional data of two points sandwiching the maximum value. Consequently, a linear portion detecting apparatus capable of detecting the linear portion by a simple structure can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12 to 16 are flow charts showing the operation of the apparatus for exposing the periphery in accordance with the present invention;

FIGS. 18 to 26 illustrate a first embodiment of the method for detecting a linear portion of a wafer in accordance with the present invention.

DESCRIPTION OF THE PREFERRED EMBODIMENTS

Figure 1A:
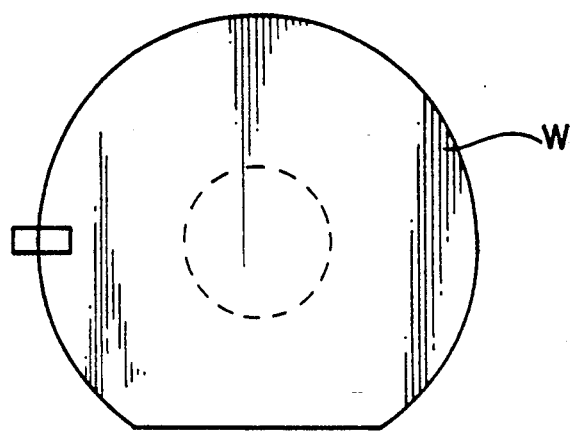
FIGS. 1A and 1B are a plan view and a front view, respectively, of a conventional apparatus for exposing periphery.
Figure 1B:
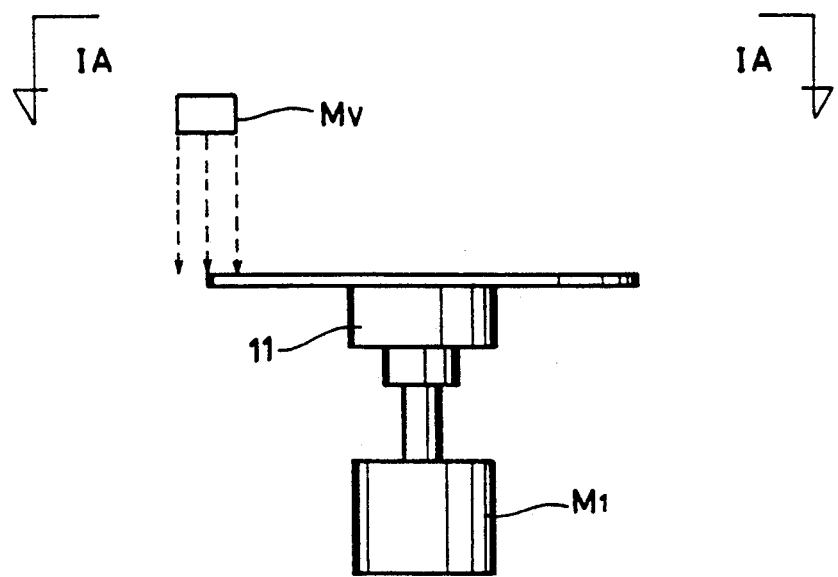
Figure 2A:
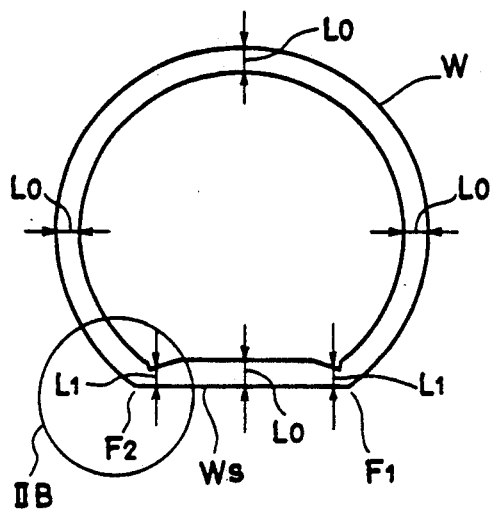
FIG. 2A shows relation between a wafer and an exposure portion on the wafer.
Figure 2B:
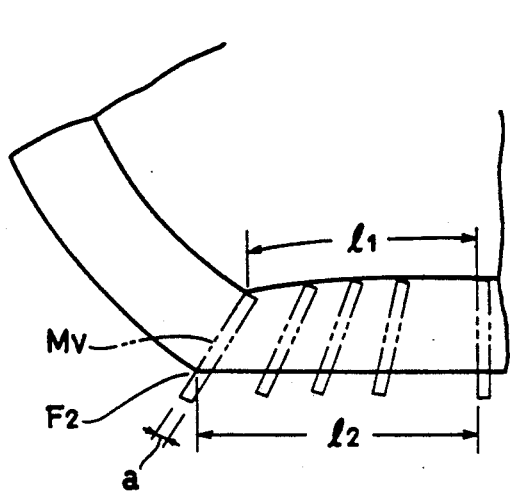
FIG. 2B is an enlarged view of a portion represented by IIB of FIG. 2A.

The structure of the apparatus 1 for exposing periphery of a wafer will be described with reference to the perspective view of FIG. 6. The apparatus 1 for exposing the periphery of the wafer comprises a rotating apparatus $M\theta$ for rotatably supporting the wafer W and an illuminating portion M1 for emitting light to the wafer.

The rotating apparatus $M\theta$ includes a table 11 serving as a spin chuck for holding the wafer W by suction, and a first motor M1 for rotating the table 11. The light illuminating portion M1 includes a light source portion Ms, a light emitting apparatus Mv connected to the light source portion Ms for emitting light to expose the periphery of the wafer W, and an illuminating apparatus moving portion Mm for relatively moving the illuminating apparatus Mv to the wafer W. A line sensor 19 for detecting a linear portion of the periphery is provided near the table 1 on the side opposite to the illuminating apparatus Mv, in the apparatus 1 for exposing the periphery. A light source, not shown, is provided above the line sensor 19 with the wafer W positioned therebetween.

The light source portion Ms includes a mercury xenon arc lamp 12, an elliptical mirror 13, an ultra violet ray transmitting filter 14, a shutter 15 and the like. The illuminating apparatus moving portion Mm includes a radial direction moving apparatus Mx for moving the illuminating apparatus Mv relatively to the central portion of the table, and a tangential direction moving apparatus My for moving the radial direction moving apparatus Mx in a direction crossing the radial direction. The radial direction moving apparatus Mx includes an X table 18x and a second motor M2. The tangential direction moving apparatus My includes a Y table 18y and a third motor M3.

The illuminating apparatus Mv includes an optical fiber 6 for guiding light from the lamp 2 to a light emitting end 7, and a fiber supporting arm 17 for supporting the optical fiber 6 on the Y table 18y.

The shape of the ultra violet spot emitted from the emitting end 7 of the optical fiber 6 to the periphery of the wafer W is as follows. If the spot is circular, the central portion of the circular spot moves along the end portion of the wafer. However, the inner side of the wafer is illuminated by the end portion of the circular spot. At the end portion of the circular spot, the total light intensity is smaller as compared with that at the central portion. Consequently, there is a possibility that the resist is not sufficiently removed, as the amount of exposure is reduced. Accordingly, the spot should have square shape.

Figure 7:
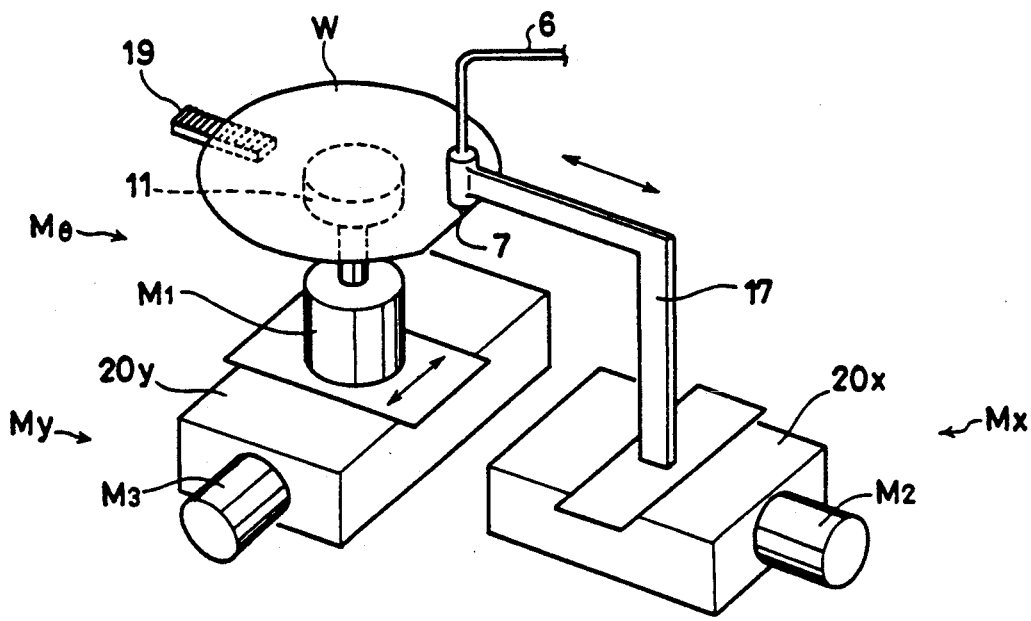

FIG. 7 is a perspective view showing another embodiment of the apparatus for exposing the periphery of a wafer. In this embodiment, the tangential direction moving apparatus My is provided below the rotating apparatus $M\theta$, and the optical fiber 6 is supported only by the radial direction moving apparatus Mx.

Figure 6:
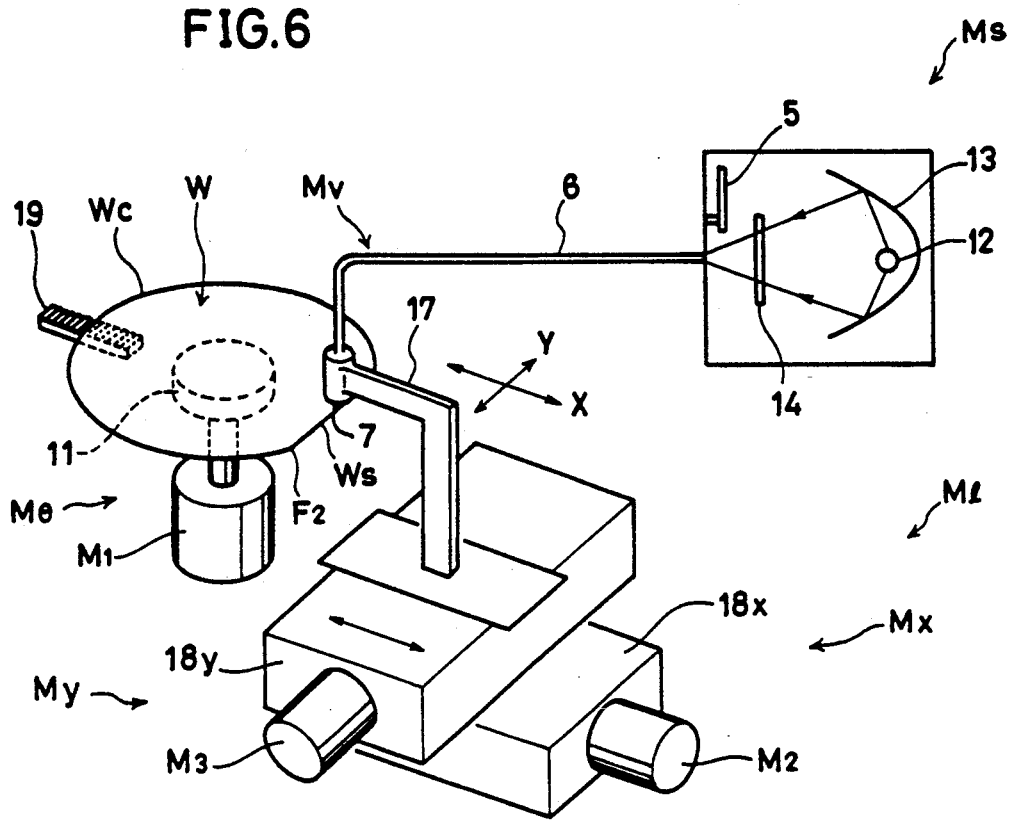
FIGS. 6 and 7 are perspective views showing the apparatus for exposing the periphery in accordance with the present invention.

Instead of the structure shown in FIGS. 6 and 7, the radial direction moving apparatus Mx may move the rotating apparatus $M\theta$. The fiber supporting arm 17 of the illuminating apparatus Mv may be fixed and the rotating apparatus $M\theta$ may be provided on the moving portion Mm.

Methods for detecting a linear portion Ws of the wafer supported by suction on the spin chuck 1, and of obtaining information of the angle of rotation of the wafer W based on the detection of the linear portion is described next.

The center of the wafer W is aligned with the center of rotation of the spin chuck 1 by an alignment mechanism, not shown. When the centering is completed, vacuum suction is applied through the table 11 serving as the spin chuck, whereby the wafer W is held to the table 11.

The wafer W is rotated by the first motor M1. While the arc portion Wc is passing over the line sensor 19, the number of cells of the line sensor 19 which are ON remains constant. At the moment when one of the wafer end portions F1, which are the boundary between the linear portion Ws and the arc portion Wc, passes the line sensor 19, the number of cells of the line sensor 19 which are ON increases. One wafer end portion F1 can be detected by this increased of the cells which are ON.

The wafer W is further rotated. Until the center of the linear portion Ws reaches the line sensor 19, the number of cells of the line sensor 19 which are ON continues to increase. From the center, the number of cells which are ON begins to decrease from the maximum value. When the other one of the wafer end portions F2 passes the line sensor 9, the decrease of the number of cells which are ON stops and the number becomes constant. The other wafer end portion F2 can be thus detected by this change.

The motor M1 is a stepping motor containing a pulse encoder (not shown). The angle of rotation corresponding to the number of pulses from the original position of the pulse encoder to the detection of one wafer end portion F1 is represented by $\theta 1$, and the angle of rotation corresponding to the number of pulses to the detection of the other wafer end portion F2 is represented by $\theta 2$. The angle from the original position to a position where the pulse number corresponds to the angle $\alpha_0 = \{(\theta 2 - \theta 1)/2\} + \theta 1$ is the angle of rotation from the central position to the center of the linear portion Ws. This is regarded as a reference angle $\alpha_0$ of the wafer W. See FIG. 9(a).

After the reference angle $\alpha_0$ at the center of the linear portion Ws is calculated in this manner, the wafer W is rotated once again. The motor M1 is stopped when the number of pulses corresponding to the reference angle $\alpha_0$ is detected. At this time, the wafer W is stopped with the linear portion Ws being parallel to the direction of moving of the tangential direction moving apparatus My, that is, the Y direction. The tangential direction moving apparatus My is driven in this state, whereby linear exposure of the wafer linear portion Ws is done.

The information of the angle of rotation of the wafer W with the wafer W being rotated can be provided as the sum of the reference angle $\alpha_0$ and the angle corresponding to the difference between the number of pulses from the original position to the present position and the number of pulses from the original position to the reference angle $\alpha_0$.

The reference angle $\alpha_0$ is calculated based on the detection of the wafer end portions F1 and F2 on both ends of the linear portion Ws. However, it may be calculated not based on the end portions F1 and F2 but on detection of two specified positions on the linear portion Ws. More specifically, the radius of the wafer W is represented as R, and the distance from the center of the linear portion Ws to the center of the wafer W is represented as S. By placing a linear portion detecting apparatus such as a photo sensor at a position of the radius R from the center of the wafer W (where $R < r < S$), two specific portions on the linear portion Ws can be detected by one rotation of the wafer W. If we represent the angle of rotation at that time as $\theta 3$ and $\theta 4$, respectively, the reference angle $\alpha_0$ corresponds to $\{(\theta 4 - \theta 3)/2\} + \theta 3$.

The structure and operation of a controlling apparatus for the apparatus for exposing the periphery in accordance with the present invention will be described now. The apparatus for exposing the periphery in accordance with the present invention comprises three apparatuses described below.

(i) First apparatus

Figure 8:
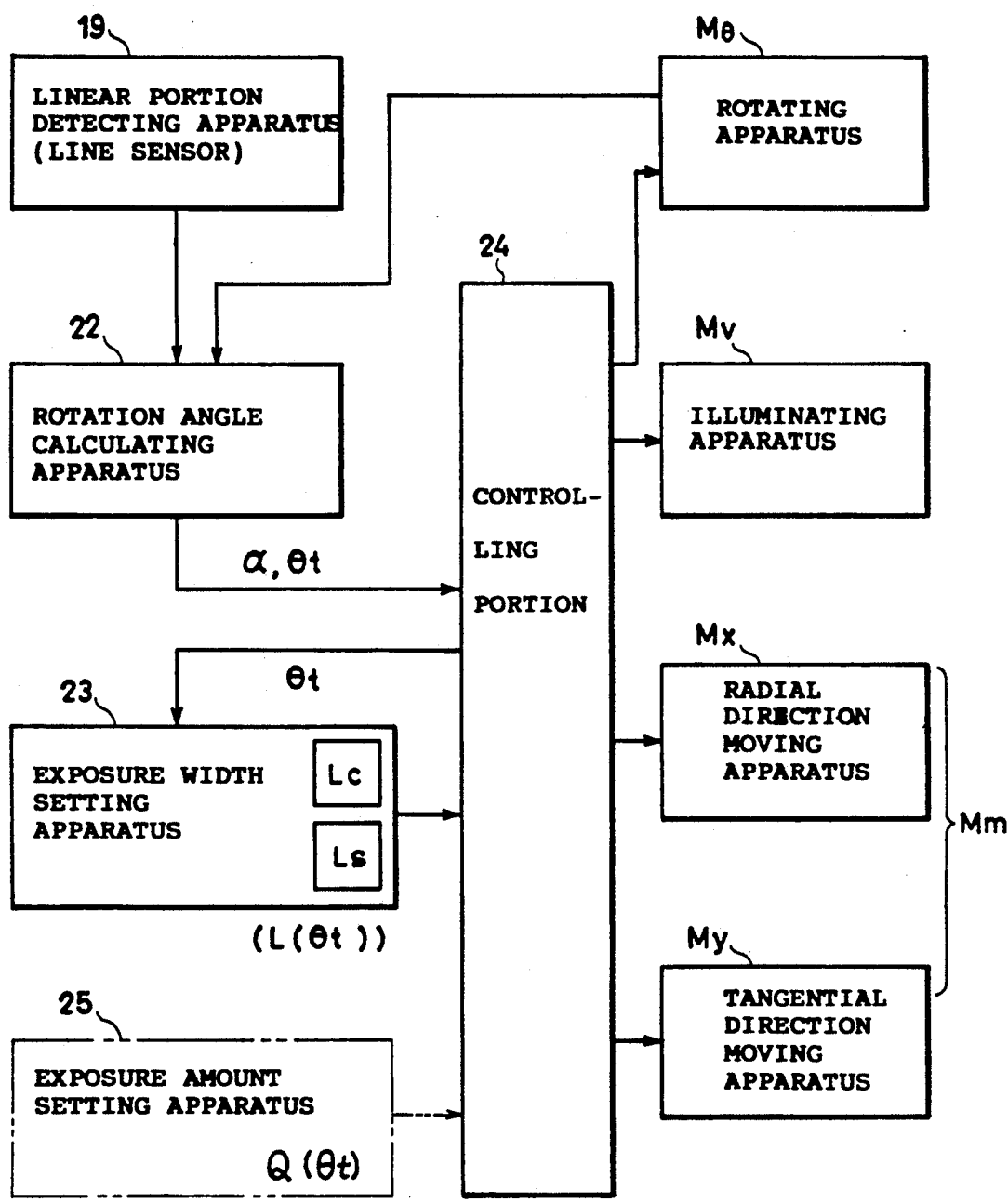
FIG. 8 is a block diagram showing a main portion of the apparatus for exposing the periphery in accordance with the present invention.

Referring to FIG. 8, the first controlling apparatus of the periphery exposing apparatus comprises a controlling portion 24 for controlling the entire apparatus. The controlling portion 24 controls the rotating apparatus $M\theta$ of the wafer, the illuminating apparatus Mv, the radial direction moving apparatus Mx and the tangential direction moving apparatus My in accordance with the signals outputted from the line sensor 19 serving as the linear portion, detecting apparatus, the rotation angle which calculates apparatus 22 calculating the angle of rotation of the wafer W based on the output signal from the line sensor 19 and from the exposure width setting apparatus 23 which sets the desired exposure width of the periphery.

The wafer W placed on the table 11 is centered by an alignment mechanism, not shown. Thereafter, it is supported on the table 11 by suction, using the spin chuck. The first motor M1 constituting the rotating apparatus ,$\theta$ is driven, and the table 11 is rotated in one direction The rotation angle calculating apparatus 22 calculates the reference angle $\alpha$ in accordance with the following equations, based on the angle $\theta 1$ (or $\theta 3$) and the angle $\theta 2$ (or $\theta 4$) from the original position inputted from the line sensor 19.

Figure 9:
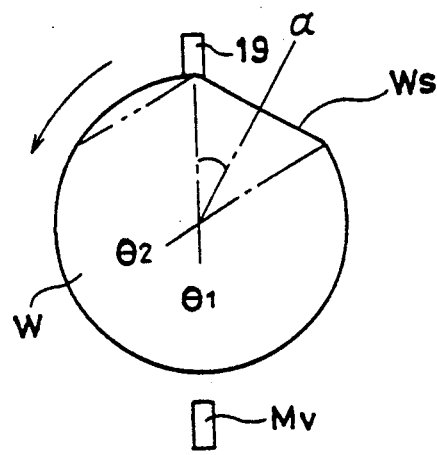
FIGS. 9(a) through 9(f), 10(a) through 10(f), and 11(a) through 11(f) illustrate state of exposure of the periphery of the wafer by the apparatus for exposing the periphery in accordance with the present invention.
Figure 9:
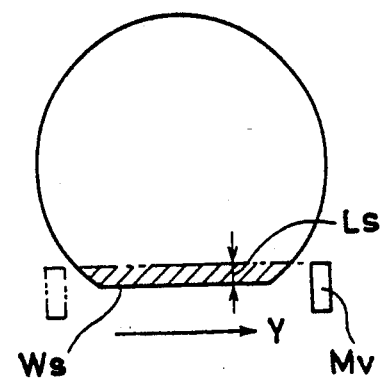
Figure 9:
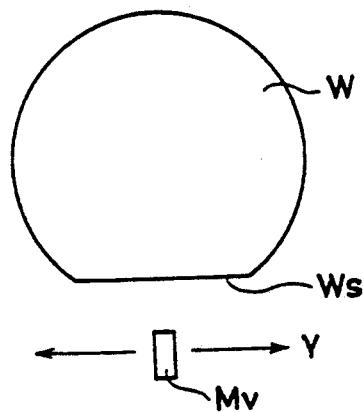
Figure 9:
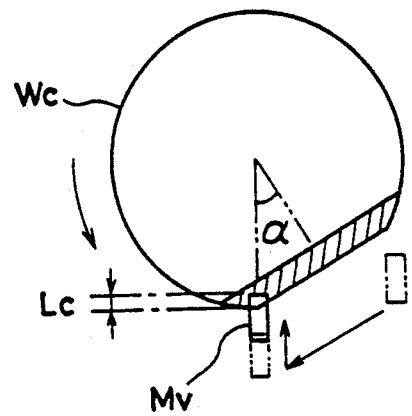
Figure 9:
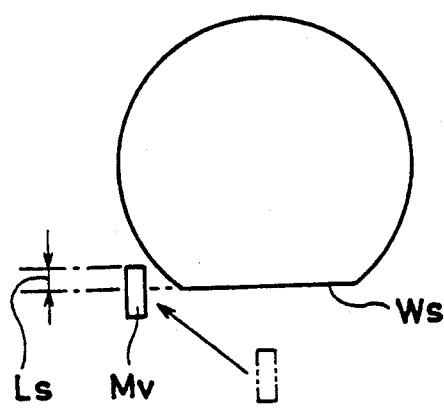
Figure 9:
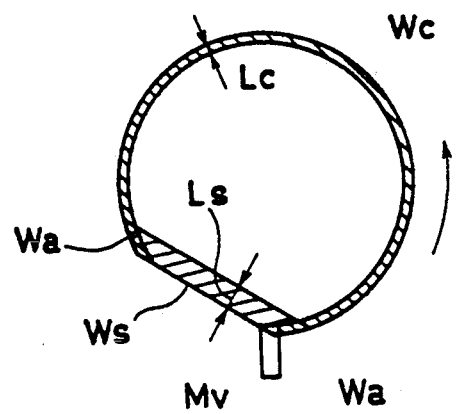

$\alpha_0 = \{(\theta 2 - \theta 1)/2\} + \theta 1$ or $\alpha_0 = \{(\theta 4 - \theta 3)/2\} + \theta 3$ (see FIG. 9(a)

The controlling portion 24 receives the reference angle $\alpha_0$ and drives the rotating apparatus $M\theta$. The rotation angle calculating apparatus 22 also compares the information $\theta t$ of the rotation angle from the original position inputted from the line sensor 19 with the reference angle $\alpha_0$ in the second rotation. When $\theta t = \alpha_0$ is satisfied, a stop instruction signal for stopping the rotating apparatus $M\theta$ is outputted to the controlling portion 24. Upon reception of this signal, the controlling portion 24 stops the rotating apparatus $M\theta$. At this time, the wafer W is stopped with the linear portion Ws in parallel to the direction of movement of the tangential direction moving apparatus My, that is, the Y direction (see FIG. 9(b)).

Thereafter, preparations for exposing the linear portion Ws are carried out. Namely, the controlling portion 24 reads the width Ls of exposure of the linear portion from the exposure width setting apparatus 23, and drives the radial direction moving apparatus Mx based on the read width so as to position the illuminating apparatus Mv relative to the linear portion Ws of the wafer. Before, after or at the same time of this operation, the tangential direction moving apparatus My is driven such that the illuminating apparatus Mv is positioned external to the end portion of the wafer linear portion Ws (see FIG. 9(c)).

The controlling portion 24 opens a shutter 15 of the illuminating apparatus Mv to start emission of ultra violet rays from the light emitting end 7 of the optical fiber. At the same time, the tangential direction moving apparatus My is driven, so that the illuminating apparatus My is linearly moved along the Y direction. The wafer linear portion Ws is uniformly exposed by the set width Ls of exposure of the linear portion, linearly by the ultra violet rays from the light emitting end 7 of the optical fiber (see FIG. 9(d)). When the light emitting end 7 of the optical fiber passes the other end of the wafer linear portion Ws, the shutter 5 is closed.

Thereafter, preparation for exposing the arc portion is started. The controlling portion 24 drives the rotating apparatus $M\theta$ to rotate the wafer W by a predetermined angle $\alpha_1$. The tangential direction moving apparatus My is driven in the opposite direction, so that the illuminating apparatus Mv is returned to the original position. Thereafter, the controlling portion 24 reads the width Lc for exposing the arc portion from the exposure width value setting apparatus 23. The radial direction moving apparatus Mx is driven based on the read width, and the illuminating apparatus Mv is positioned relative to the arc portion Wc of the wafer (see FIG. 9(e)).

The controlling portion 24 opens the shutter 15 of the illuminating apparatus Mv to start emission of ultra violet rays from the light emitting end 7 of the optical fiber again. At the same time, by driving the rotating apparatus $M\theta$, the wafer W is rotated about the illuminating apparatus Mv. The wafer arc portion Wc is exposed uniformly by the width Lc for exposing the arc portion, with the ultra violet ray from the light emitting end 7 of the optical fiber (see FIG. 9(f)) When the light emitting end 7 of the optical fiber passes the terminal end of the wafer arc portion Wc, the shutter 5 is closed. The radial direction moving apparatus Mx is driven, and the illuminating apparatus Mv is returned to the original position.

In this manner, the wafer linear portion Ws is exposed by the uniform width Ls over the entire length of the linear portion Ws. The value Ls is independent of the width exposure value Lc of the wafer arc portion Wc.

FIGS. 12 to 14 are flow charts showing the operation of the periphery exposing apparatus.

In the above described example, the controlling portion 24 exposes the linear portion Ws first, and then the arc portion Wc. Alternatively, the arc portion Wc may be exposed at first, and followed by the exposure of the linear portion Ws.

The widths Lc and Ls of the arc portion and the linear portion can be arbitrarily selected, and the widths of exposure Lc and Ls can be freely set and combined, dependent on conditions and objects.

(ii) Second apparatus

The structure of the second controlling apparatus of the periphery exposing apparatus is the same as that of the first apparatus.

However, the exposure width setting apparatus is capable of setting different and many exposure widths, not only the simple setting of the width for the arc portion Wc and of the linear portion Ws. Especially, at the arc portion Wc, the width $L(\theta t)$ of exposure corresponding to the rotation angle $\theta t$ can be set. The controlling portion 24 reads the exposure width $L(\theta t)$ corresponding to the angle of rotation $\theta t$ at that time from the exposure position setting apparatus 23, based on the rotation angle $\theta t$. The radial direction moving apparatus Mx is driven based on the exposure width $L(\theta t)$ so as to adjust the position of the illuminating apparatus Mv relative to the wafer W.

Figure 10:
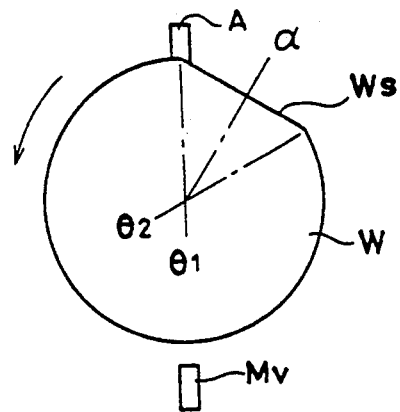
Figure 10:
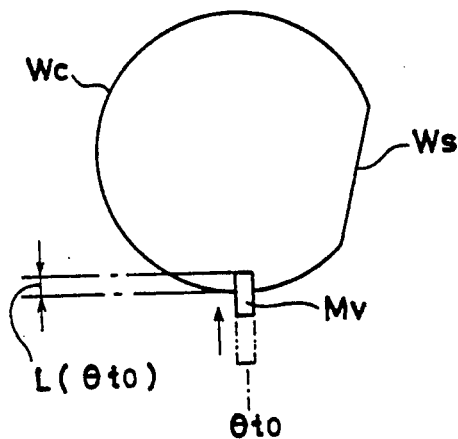
Figure 10:
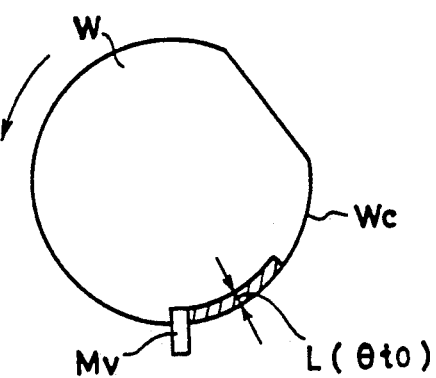
Figure 10:
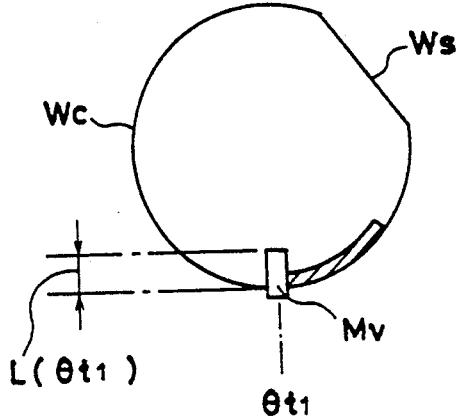
Figure 10:
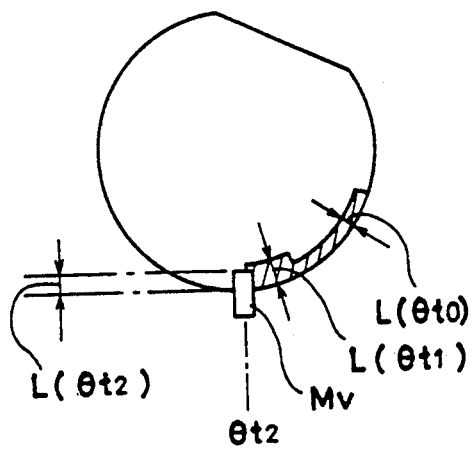
Figure 10:
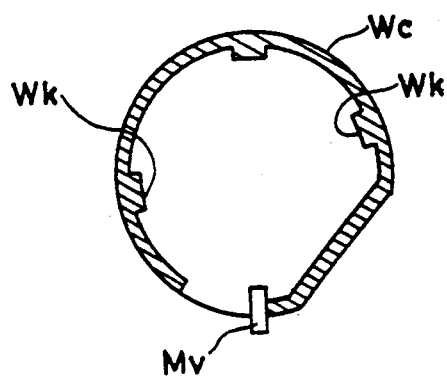

While the controlling portion 24 rotates the wafer W by driving the rotating apparatus $M\theta$, the rotation angle calculating apparatus 22 calculates the reference angle $\alpha_0$ based on the detecting signal from the linear portion detecting apparatus 19 (see FIG. 10(a)).

After the reference angle $\alpha_0$ is calculated, the controlling portion 24 stops driving the rotating apparatus M$\theta$ in preparation for exposure. More specifically, the controlling portion 24 reads the exposure width L($\theta$t0) corresponding to the stop angle $\theta$t0 from the exposure width setting apparatus 23. The radial direction moving apparatus Mx is driven based on this width and the illuminating apparatus is positioned relative to the arc portion Wc of the wafer (see FIG. 10(b)).

The controlling portion 24 opens the shutter 5 of the illuminating apparatus Mv to start emission of ultra violet rays from the light emitting end 7 of the optical fiber. The rotating apparatus M$\theta$ is driven to rotate the wafer W, and the arc portion Wc of the wafer is exposed (see FIG. 10(c)). During this period, the present angle of rotation $\theta$t calculated by the rotation angle calculating apparatus 22 is continuously monitored based on signals from the pulse encoder of the rotating apparatus M$\theta$.

When the rotation angle $\theta$t reaches the changing point $\theta$t1 of the exposure width, the controlling portion 24 stops the rotating apparatus M$\theta$. The radial direction moving apparatus Mx is moved based on the exposure width L($\theta$t1) read from the exposure width setting apparatus 23, and the position of the illuminating apparatus Mv is again adjusted relative to the arc portion Wc of the wafer (see FIG. 10(d)).

The rotating apparatus M$\theta$ is again driven to rotate the wafer W, and the arc portion Wc is exposed by the new exposure width L($\theta$t1). When the rotation angle $\theta$t reaches the changing point $\theta$t2 of the exposure width, the controlling portion 24 stops the rotating apparatus M$\theta$. The radial direction moving apparatus Mx is driven based on the exposure width L($\theta$t2) read from the exposure width setting apparatus 23, and the position of the illuminating apparatus Mv is again adjusted relative to the arc portion Wc of the wafer (see FIG. 10(e)).

Generally, the width is set as $$L(\theta t2) = L(\theta t0) < L(\theta t1).$$

This is to remove resist in the regions Wk which are to be clamped by the clamp pawls k.

In this manner, a plurality of clamping regions Wk having greater widths are exposed at the arc portions Wc of the wafer (see FIG. 10(f)).

When the linear portion Ws of the wafer is to be exposed, the width of exposure can be adjusted stepwise directly in accordance with the exposure width L ($\theta t_i$) at the rotation angle $\theta t_i$. Namely, the linear portion Ws is also exposed based on the exposure width set corresponding to the rotation angle. In this case, the tangential direction moving apparatus My is unnecessary.

Alternatively, by detecting the wafer end portion F1, the wafer linear portion Ws is made parallel to the Y direction as in FIG. 9(b) and the linear portion Ws may be exposed by linearly moving the illuminating apparatus Mv by driving the tangential direction moving apparatus My.

As another method, the wafer W may be rotated twice. At the first rotation, exposure is continuously done by narrower exposure width L($\theta$t0). In the second rotation, a greater exposure width L($\theta$t1) is set. When the wafer reaches the rotation angle corresponding to the greater width, the shutter 5 is opened to expose the wafer. At other angles, the shutter 5 is kept closed.

Figure 15:
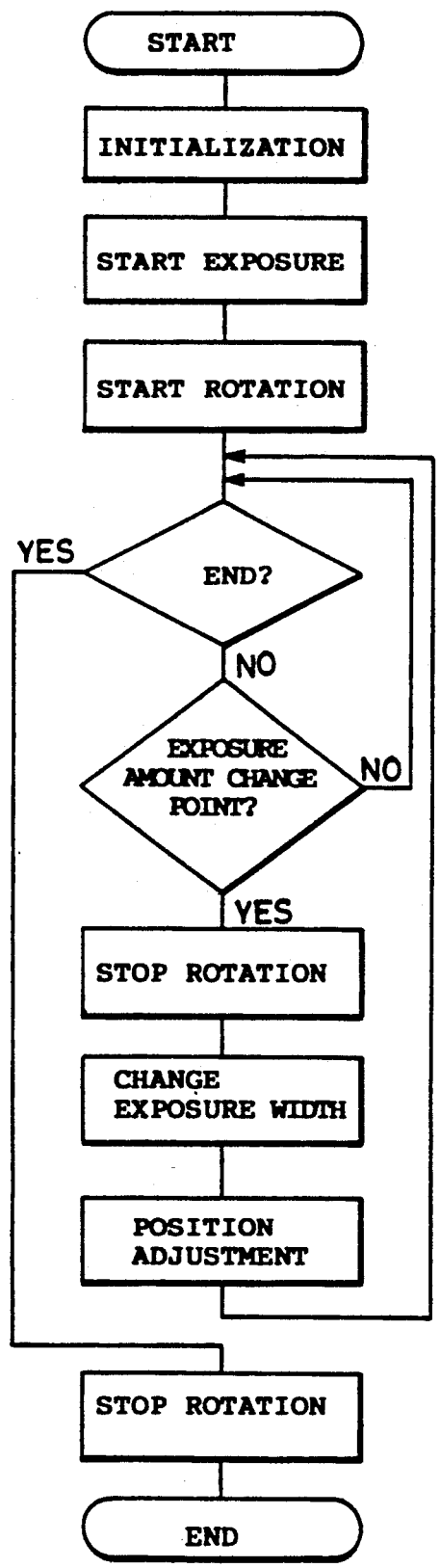

The flow chart of this operation is shown in FIG. 15.

(iii) Third apparatus

The structure of the third controlling apparatus for exposing the periphery apparatus is the same as that of the first apparatus, except for the provision of an exposure amount setting apparatus 25 for setting the amount of exposure Q($\theta$t) corresponding to the rotation angle $\theta$t, shown in phantom in FIG. 8. The controlling portion 24 reads the exposure amount Q($\theta$t) corresponding to the rotation angle $\theta$t at that time from the exposure amount setting apparatus 25 based on the rotation angle $\theta$t, and the amount of exposure to the wafer W from the illuminating apparatus Mv is adjusted based on the amount Q($\theta$t).

Figure 3:
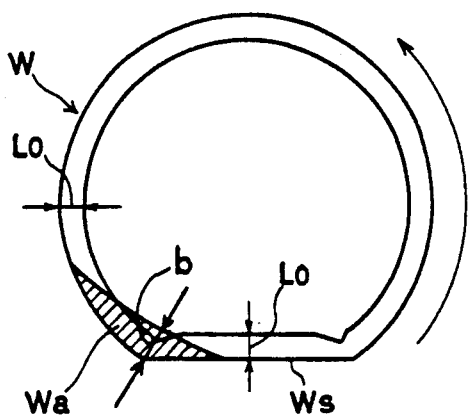
FIGS. 3 to 5 show problems of the conventional apparatus for exposing the periphery.
Figure 4:
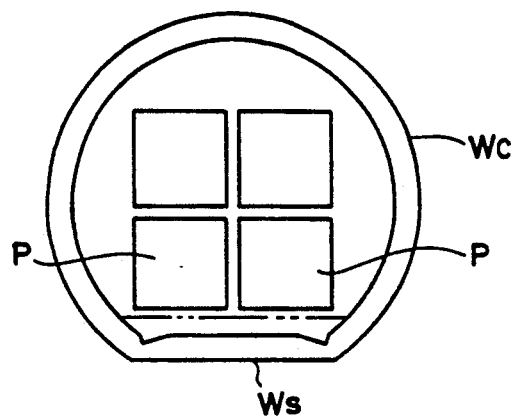
Figure 5:
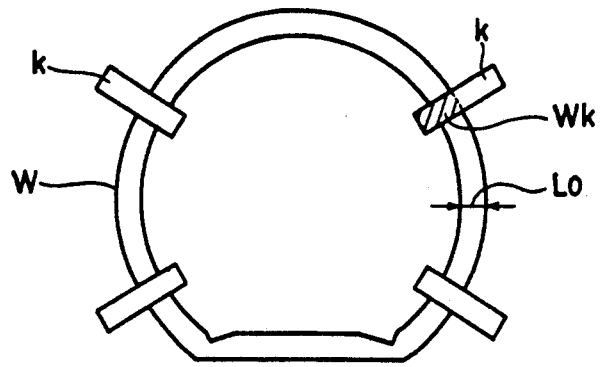

The intensity of the ultra violet rays emitted from the lamp 2 and passing through the ultra violet rays transmitting filter 14 is represented as $I_0$ (constant), the radius of the wafer W is represented as r, the rotational angular velocity is represented by $\omega$ and the peripheral velocity is represented as v. The relation V = r$\omega$ applies. Since the amount of exposure Q becomes smaller as the peripheral velocity V is increased, $Q \propto I_0/v$. On the other hand, the peripheral velocity v must be made slower at the angular range where much exposure is necessary. The reason for this is due to the fact that the relation $v \propto I_0/Q$ holds. The thick region Wa shown in FIG. 3 is one such range.

Figure 11:
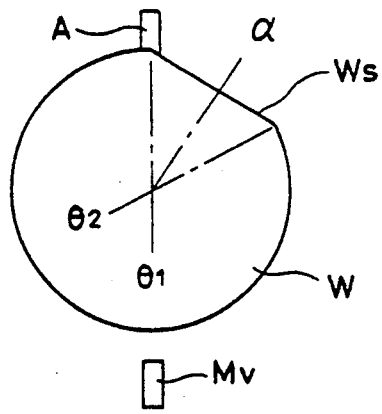
Figure 11:
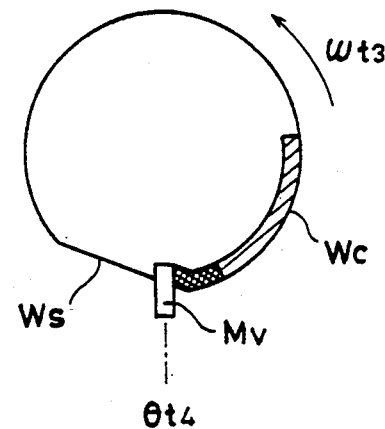
Figure 11:
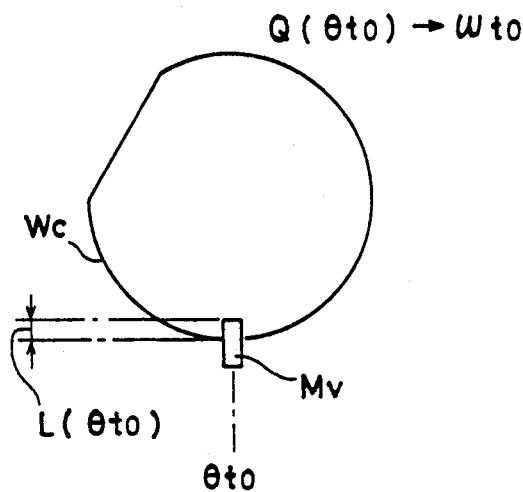
Figure 11:
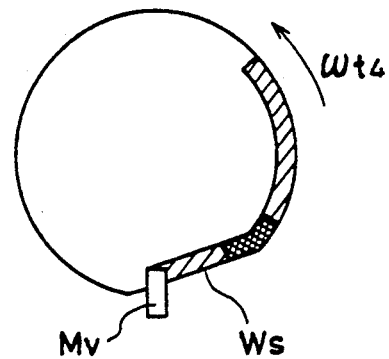
Figure 11:
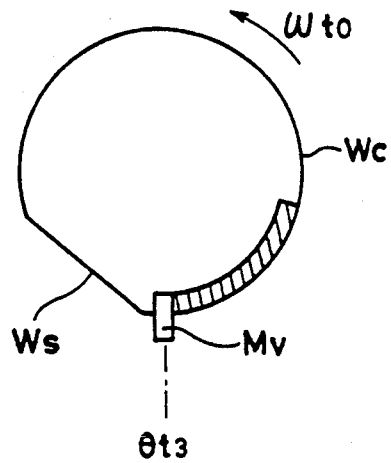
Figure 11:
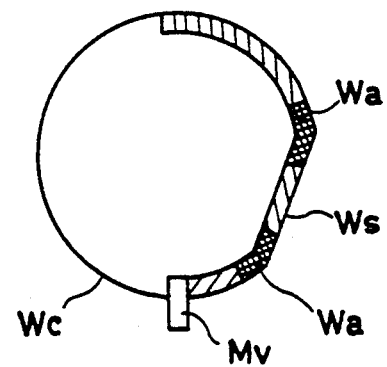

The controlling portion 24 drives the rotating apparatus M$\theta$ to rotate the wafer W, while the rotation angle calculating apparatus 22 calculates the reference angle $\alpha_0$ based on the detecting signal from the linear portion detecting apparatus 19 (see FIG. 11 (a)).

After the reference angle $\alpha_0$ is calculated, the controlling portion 24 stops driving the rotating apparatus M$\theta$ to prepare for the exposure process. The controlling portion 24 reads the exposure width L($\theta$t0) corresponding to the stop angle $\theta$t0 from the exposure width setting apparatus 24, and the radial direction moving apparatus Mx is driven based on the read width to position the illuminating apparatus Mv relative to the arc portion Wc of the wafer. At the same time, the controlling portion 24 reads the amount of exposure Q($\theta$t0) corresponding to the stop angle $\theta$t0 from the exposure amount setting apparatus 25 and sets the rotational angular velocity $\omega$t0 corresponding thereto (see FIG. 11(b)).

The controlling portion 24 opens the shutter 15 of the illuminating apparatus Mv to start emission of ultra violet rays from the light emitting end 7 of the optical fiber. At the same time, the rotating apparatus M$\theta$ is driven at the angular velocity $\omega$t0, so that the wafer W is rotated and the arc portion Wc of the wafer is exposed (see FIG. 11(c)). During this period, the present rotation angle $\theta$t calculated by the rotation angle calculating apparatus 22 is continuously monitored based on the signals from the pulse encoder of the rotating apparatus M$\theta$.

When the angle of rotation $\theta$t reaches the changing point $\theta$t3 of the amount of exposure, the rotating apparatus M$\theta$ is rotated at the angular velocity $\omega$t3 based on the amount of exposure Q($\theta$t3) read from the exposure amount setting apparatus 24 (see FIG. 11(b)). On this occasion, $\omega$t3 < $\omega$t0.

When the rotation angle $\theta$t again reaches the changing point $\theta$t4 of the exposure amount, the angular velocity of rotation $\omega$t4 is calculated based on the exposure amount Q(ωt4) read from the exposure amount setting apparatus 25. The wafer W is rotated at the rotation angular velocity ωt4 while it is exposed see FIG. 11(e)), where ωt4=ωt0.

Figure 16:
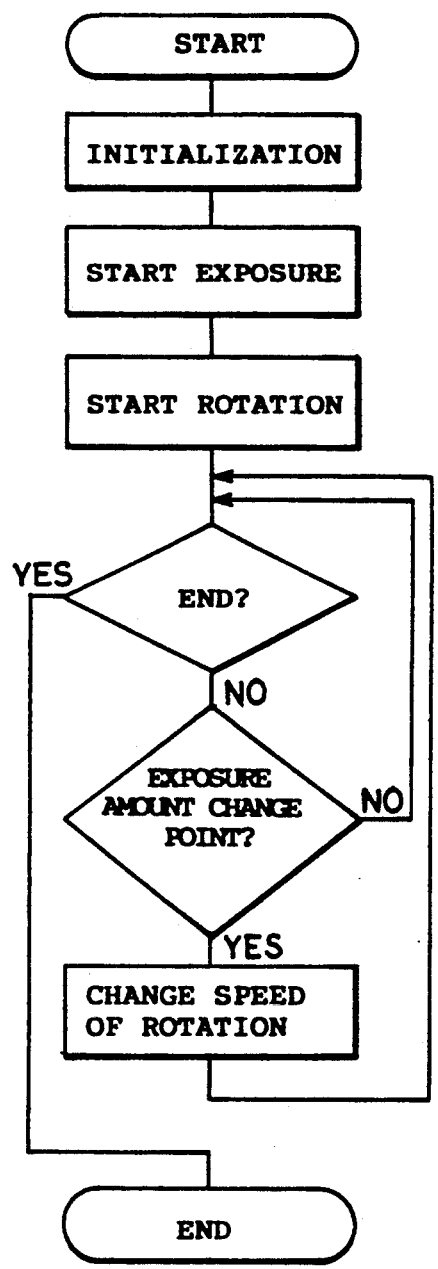

The flow chart of this operation shown in FIG. 16.

As described above, the rotational angular velocity is different in various positions; the wafer W is rotated relatively slow to increase the amount of exposure where the resist is thick; the wafer W is rotated quickly to increase the throughput of processing where the resist is thin.

When the wafer linear portion Ws is to be exposed, the amount of exposure is adjusted stepwise in accordance with the exposure amount $Q(\theta t_i)$ at every rotation angle $\theta t_i$. In this case, the tangential direction moving apparatus My becomes unnecessary, and the radial direction moving apparatus Mx is moved at every rotation angle $\theta t_1$ when the linear portion is exposed.

Alternatively, the wafer linear portion Ws may be arranged parallel to the Y direction as shown in FIG. 9(b) when the wafer end portions F1 and F2 are detected. The tangential direction moving apparatus My is driven, and the linear portion Ws may be exposed by the illuminating apparatus Mv being moved linearly. In that case, the exposure amount corresponding to the position in the Y direction may be also set in the exposure amount setting apparatus 23, so that speed of the tangential direction moving apparatus My is controlled based on the set exposure amount. By doing so, the amount of exposure can be controlled over the linear portion in this case also.

As another method, the wafer W may be rotated twice. During a first rotation, the wafer is rotated at a constant speed for the entire periphery, and during a second rotation, the shutter 5 is opened for exposing positions where greater intensity is necessary, and the shutter 5 is kept closed at other portions to control the amount of exposure. Although a stepping motor of the type incorporating a pulse encoder is employed as the motor M1 in the above embodiment, a stepping motor not including an encoder can be applied in the present invention.

The details of the apparatus for detecting the linear portion Ws of the wafer are as follows.

(i) First embodiment of the wafer linear portion detecting apparatus.

Figure 17A:
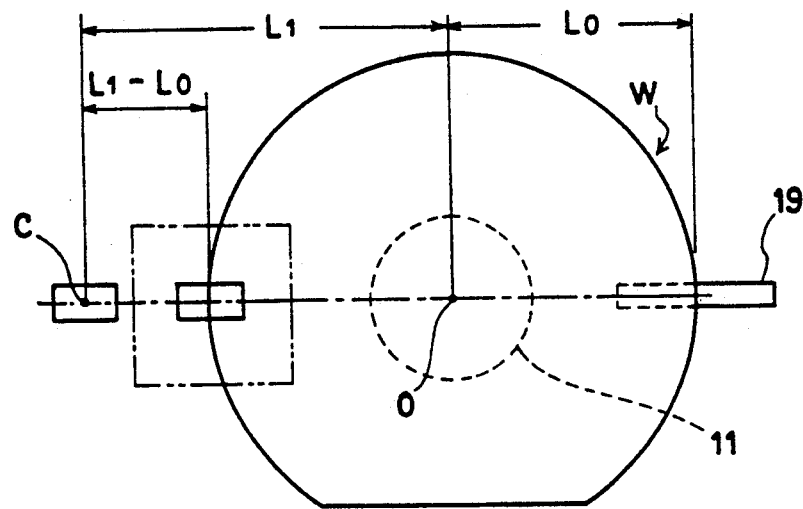
FIG. 17A is a plan view showing the first embodiment of the wafer linear portion detecting apparatus.
Figure 17B:
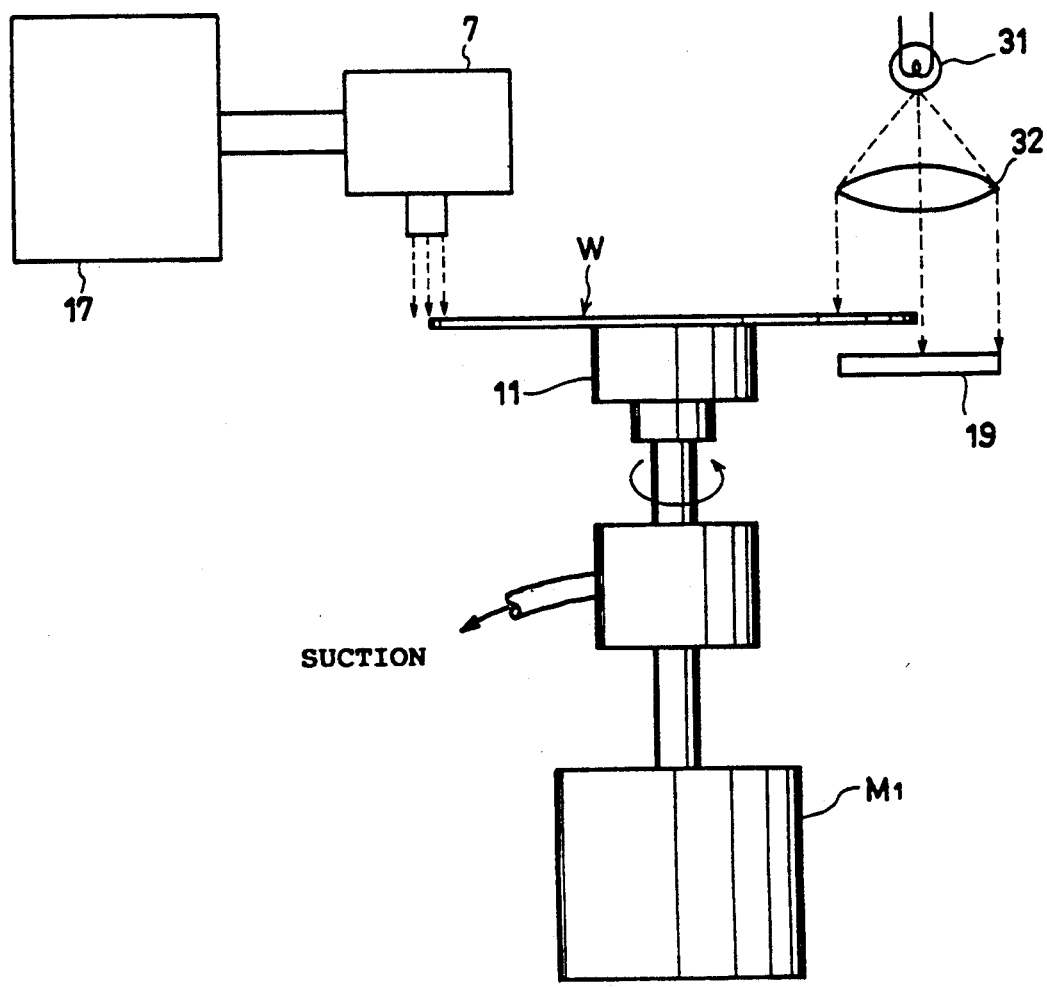
FIG. 17B is a front view of the periphery exposing apparatus shown in FIG. 17A.

FIG. 17A is a plan view showing the first embodiment of the wafer linear portion detecting apparatus. FIG. 17B is a front view of the periphery exposing apparatus shown in FIG. 17A. These figures are basically the same as FIGS. 6 and 7. However, for the simplicity, the tangential direction moving apparatus My and the like are omitted, and the light source portion Ms and the illuminating apparatus Mv are shown schematically. A light source 31 and an optical system 32 are provided above the line sensor 19. The line sensor 19 is arranged such that the edge of the arc portion of the wafer W is located over the center of a valid pixel region of the line sensor 19, when the wafer W is placed centered on the table 11.

Figure 19:
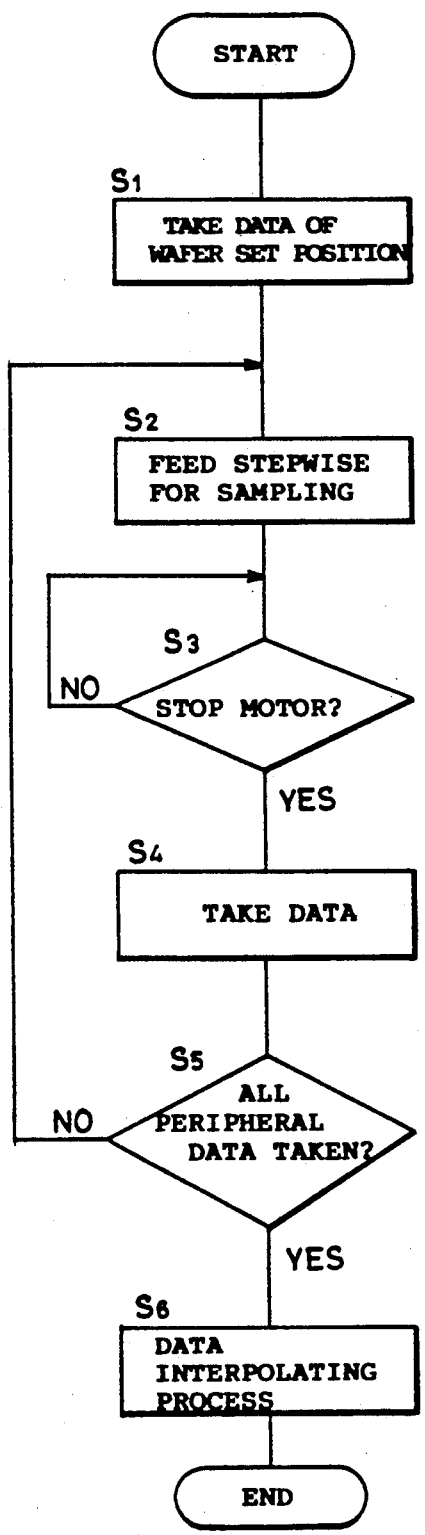

FIG. 18 is a block diagram showing a main portion of the linear portion detecting apparatus in accordance with the first embodiment. The relation between FIG. 19 and FIG. 18 is as shown in the figure. Referring to FIG. 18, the line sensor 19 detects the peripheral position of the wafer W continuously, independent from (non-synchronously with) the rotation of the pulse motor M1, by a CCD driving circuit 33. The detecting signals are successively applied to a signal processing circuit. The signal processing circuit 34 outputs analog signals in proportion to the number of pixels of the line sensor 19 receiving the light from the light source 31, based on the detecting signals from the line sensor 19. The analog signals are applied to an A/D converter 35. A CPU 36 having a function of controlling timing of data taking applies a data taking timing signal to the A/D converter 35, and the inputted analog signals are converted into digital signals based on this timing signal. The digital signals are stored in a RAM 27 through the CPU 36, as the peripheral position data of the wafer W.

The CPU 36, a pulse generating circuit 39, and the counter 38 control stepwise feeding of pulse for the first motor M1. The pulse generating circuit 39 outputs a desired number of pulse signals to a pulse motor driving circuit 40 based on data defining the number of rotations applied from the CPU 36. The counter 38 is a programmable counter which receives data in the form of a number of rotation as preset signals from the CPU 36, which outputs a counter signal to the CPU 36, when the pulse generating circuit 39 outputs the number of pulse signals corresponding to the data of the number of rotation.

The CPU 36 and the pulse generating circuit 41 control the amount of movement in the radial direction of the light source 31 for exposure. The pulse generating circuit 41 drives and controls a second motor M2 through a pulse motor driving circuit 42, based on the number of rotation data at the time of exposure applied from the CPU 36.

The process of sampling the data of the peripheral positions of the wafer W will be described with reference to the flow chart of FIG. 19.

When the wafer W is set on the table 11, the CPU 36 outputs a timing signal for taking the peripheral position data to the A/D converter 35. Consequently, the peripheral position data of the sampling point having the $\theta$ address of 0°, that is, the point opposing the line sensor 19 is stored first in the RAM 37 through the CPU 36 (step S1).

When the first peripheral position data is taken, the CPU 36 applies a data defining number of rotations corresponding to the angle of stepwise feeding (for example 9°) for data sampling to the pulse generating circuit 39, and presets the data of the number of rotation in the counter 38. Consequently, a number of pulse signals corresponding to the data of the number of rotation are outputted from the pulse generating circuit 39 and the first motor M1 is driven. Thus, the wafer W is rotated stepwise by the prescribed angle (step S2).

When the pulse signals of the set number are outputted, the counter 38 outputs a count up signal to the CPU 36. The CPU 36 determines whether or not the first motor M1 is stopped based on the count up signal (step S3).

When the first motor M1 is stopped, the CPU 36 outputs the timing signal for taking the data to the A/D converter 35 to take the peripheral position data of the next sampling point to store the same in the RAM 37 (step S4).

When the peripheral position data are taken, the CPU 36 determines whether or not the data of the peripheral position of the entire periphery of the wafer have been taken, that is, whether or not the first motor M1 has been driven by 360° (step S5). If not, steps S2 to S4 are repeated.

Figure 21:
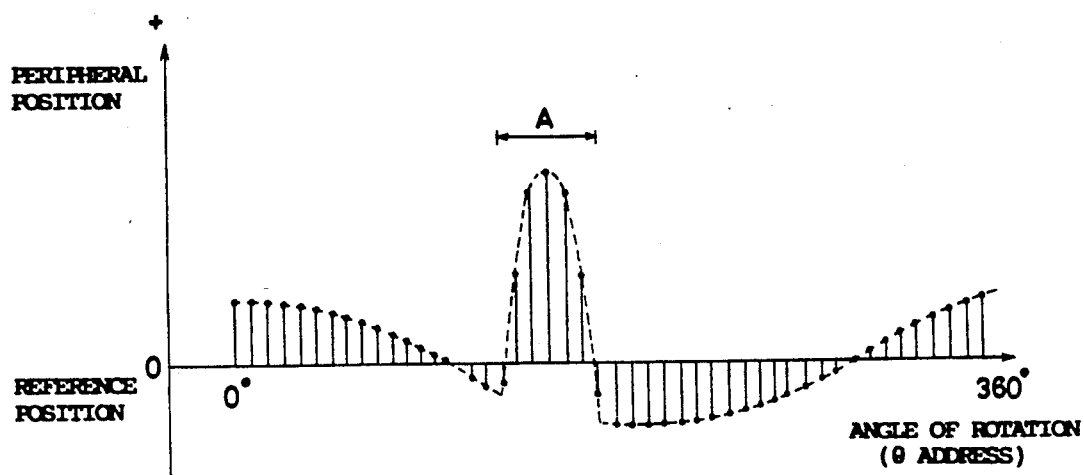

In this manner, discrete peripheral position data are taken for the entire periphery of the wafer W. FIG. 21 shows the taken peripheral position data. Since the wafer W is generally placed on the table 11 with its center a little off the center of the table, the peripheral position data smoothly changes with the reference position (the peripheral position data of the wafer arc portion when the wafer center is aligned with the center of the table) being the center. The region A of FIG. 21 shows the peripheral position data of the orientation flat.

When the peripheral position data of the entire periphery of the wafer W are taken, interpolation between the discrete peripheral position data is carried out (step S6). If the angle of stepwise feeding at the time of data sampling is sufficiently small, the interpolating process is not necessary. However, when the angle of stepwise feeding is set relatively large in order to reduce the time required for taking the data, interpolation of data is preferred to smooth the tracing of the exposure beam along the wafer periphery.

Figure 22:
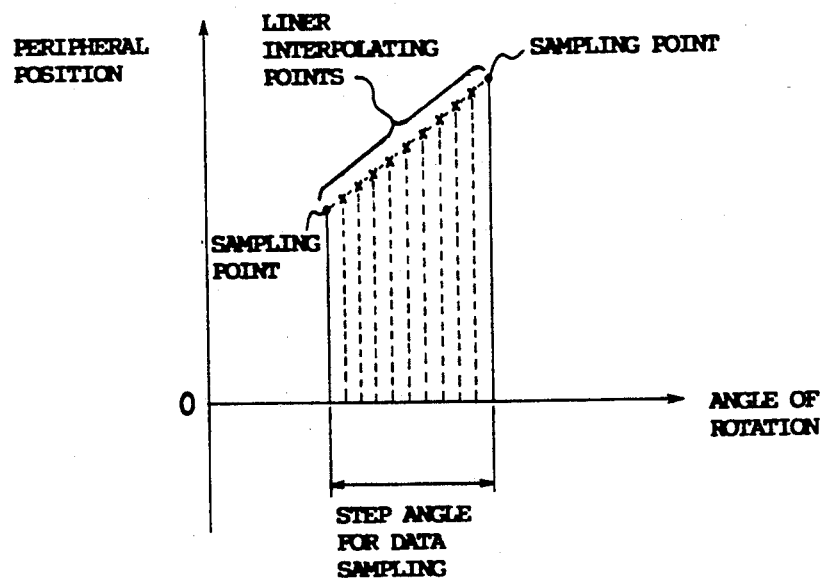

The method of interpolation is not specified. In this embodiment, it is carried out in the following manner. As to the peripheral position data of the arc portion of the wafer W, interpolating points (represented by x in the figure) dividing the space between adjacent sampling points to 10 are set, as shown enlarged in FIG. 22. The peripheral position data between each of the interpolating points is calculated by linear interpolation.

Linear interpolation may be used for the sampling points near the end portion of the orientation flat. However, in that case, the width of exposure at the end portion of the orientation flat becomes wider than at other portions. Therefore, the sampling points are interpolated in the following manner in the present embodiment.

Figure 23:
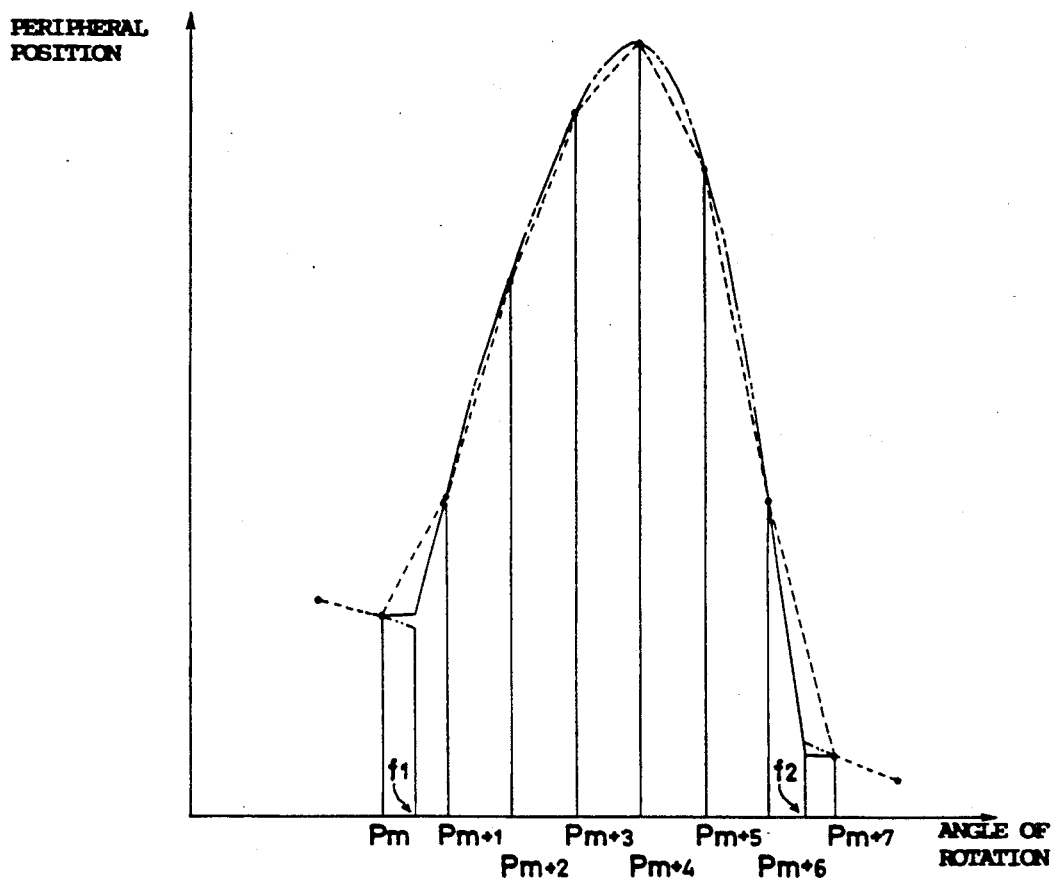
Figure 25:
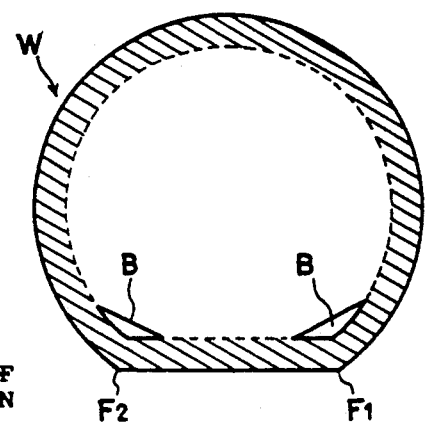

FIG. 23 shows, enlarged, the peripheral position data near the orientation flat portion out of the peripheral position data shown in FIG. 21. In the figure, the dotted line represents the profile of the peripheral position data provided by linear interpolation, and the chain line represents the profile of the actual wafer periphery. As is apparent from the figure, the error between the linear, interpolated profile and the actual profile of the wafer periphery is quite large. Due to this error, the width of exposure of the orientation flat end portion is larger than at the other exposure region (represented by the hatching), by the size of the B region shown in FIG. 25, when linear interpolation is used.

Figure 24:
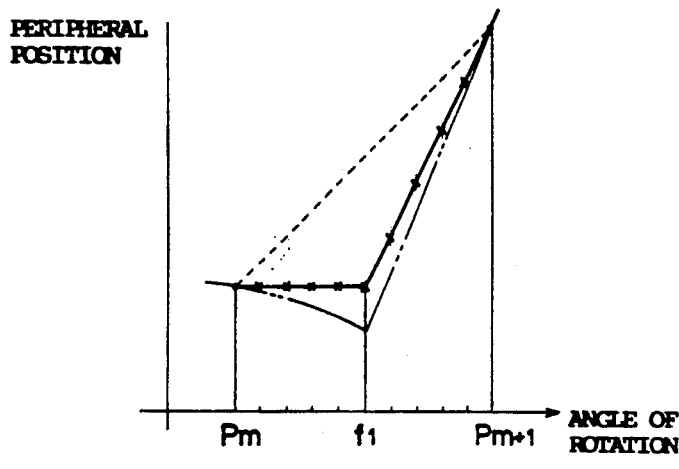

Therefore, as shown in the enlargement in FIG. 24, interpolation is carried out by using points sandwiched between the end portions of the orientation flat. More specifically, interpolation between sampling points $P_m$ and $P_{m+1}$ is done by setting data of respective interpolating points from the peripheral position data $P_m$ to the interpolating point $f_1$ corresponding to the orientation flat end portions F1. These are set equal to the peripheral position data of the sampling point $P_m$. From the interpolating point $f_1$ to the sampling point $P_{m+1}$, the peripheral position data are calculated by linear interpolation. The same interpolation is done on the other orientation flat end portion F2.

Figure 26:
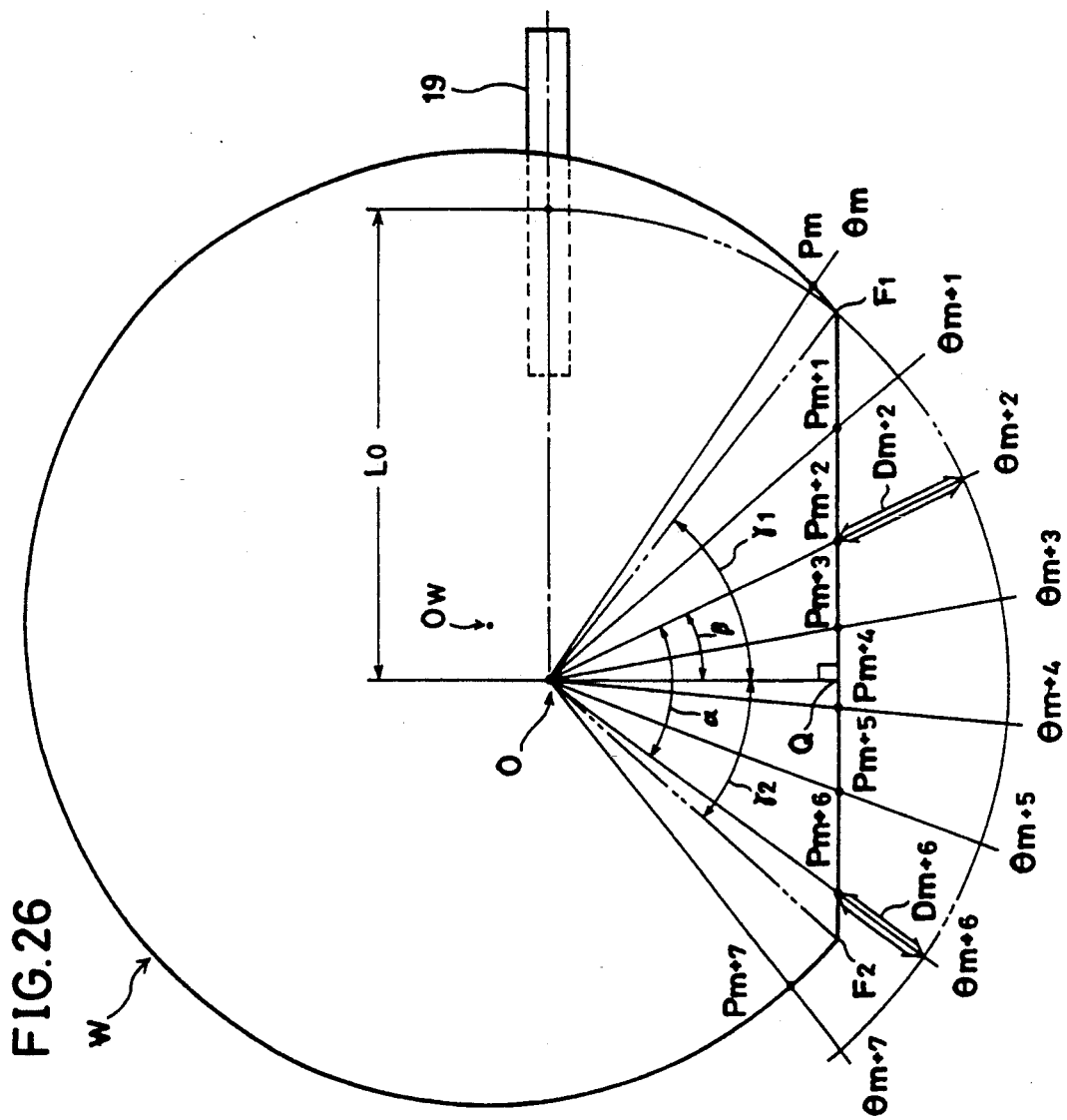

In order to determine the interpolating points $f_1$ and $f_2$ in such processing, the end positions F1 and F2 of the orientation flat are calculated, referring to FIG. 26. FIG. 26, a follows shows the state of the wafer W placed on the table 11. In the figure, the reference character $O_w$ represents the center of the wafer, O represents the center of the table, $P_m$ to $P_{m+7}$ are sampling points near the orientation flat portion, and $\theta_m$ to $\theta_{m+7}$ represent $\theta$ addresses corresponding to the rotation angles of respective sampling points.

In this embodiment, a perpendicular $\overline{OQ}$ from the center O of the table to the orientation flat is regarded as the reference line, and the position of the end portions F1 and F2 of the orientation flat are respectively represented by the open angles $\gamma_1$ and $\gamma_2$ from the reference line. The position of the reference line is calculated in the following manner.

[1] Process for calculating the position of the reference line (1) First, a sampling point having the maximum peripheral position data is selected out of the taken peripheral position data. Since the peripheral position data becomes larger as the line sensor 19 receives light for wider range, the sampling point having the maximum peripheral position data is included in the orientation flat portion, unless the wafer W is placed very much off the center of the table 11. In this example, it is assumed that the sampling point $P_{m+4}$ having the $\theta$ address $\theta+4$ is detected.

(2) Thereafter, sampling points sandwiching the sampling point $P_{m+4}$ on the orientation flat are appropriately selected. The sampling points can be determined by selecting the sampling points apart from the $\theta$ address of the sampling point having the maximum peripheral position data by a prescribed step angle. In this example, sampling points $P_{m+2}$ and $P_{m+6}$ having the addresses of $\theta_{m+2}$ and $\theta_{m+6}$ apart from two step angles from $p_{m+4}$ are selected.

(3) The length of the reference line $\overline{OQ}$ can be represented by the following equation with the opening angle between $\overline{OP}_{m+2}$ and $\overline{OP}_{m+6}$ being $\alpha$.

$$\overline{OQ} = \overline{OP}_{m+2} \cos \beta = \overline{OP}_{m+6} \cos (\alpha - \beta) \qquad (1)$$

$\overline{OP}_{m+2}$ and $\overline{OP}_{m+6}$ can be readily calculated by subtracting the peripheral position data $D_{m+2}$ and $D_{m+6}$, respectively, of the sampling points $P_{m+2}$ and $P_{m+6}$ from the distance $L_0$ between the center of the table to the central position of the CCD line sensor 19. $\alpha$ is given as $\theta_{m+6} - \theta_{m+2}$. The reference character $\beta$ shows the opening angle of the reference line $\overline{OQ}$ about the $\theta$ address $\theta_{m+2}$ of the sampling point $P_{m+2}$.

From the above equation (1), the following equation (2) for calculating the position $\beta$ of the reference line can be provided.

$$\beta = \arctan\!\left( \frac{\overline{OP}_{m+2}}{\overline{OP}_{m+4}} \operatorname{cosec} \alpha - \cot \alpha \right) \qquad (2)$$

[2] Process for calculating end position of the orientation flat

Positions $\gamma_1$ and $\gamma_2$ of the end portions F1 and F2 of the orientation flat relative to the reference line calculated in the above described manner [1] are calculated in the following manner.

(1) Near the sampling point $P_{m+4}$ having the maximum peripheral position data selected in the step (1) of reference line position calculating process [1], a sampling point having the largest rate of change of the peripheral position data is selected. The rate of change of the peripheral position data becomes the largest between the sampling points sandwiching the orientation flat end portions F1 and F2. In this example, the sampling point $P_m$ having the $\theta$ address $\theta_m$ and the sampling point $P_{m+7}$ having the $\theta$ address $\theta_{m+7}$ are selected.

(2) Since the approximation $$\overline{OF}_1 \approx \overline{OP}_m, \overline{OF}_2 \approx \overline{OP}_{m+7}$$

can be applied, the opening angle $\gamma_1$ of the $\overline{OF}_1$ about the reference line $\overline{OQ}$ can be calculated in accordance with the following equation (3), while the opening angle $\gamma_2$ of $\overline{OF}_2$ about the reference line $\overline{OQ}$ can be calculated in accordance with the following equation (4).

$$\gamma_1 = \arccos \frac{\overline{OQ}}{\overline{OP}_m} \quad (3)$$

$$\gamma_2 = \arccos \frac{\overline{OQ}}{\overline{OP}_{m+7}} \quad (4)$$

Based on the positions of the end portions $F_1$ and $F_2$ of the orientation flat calculated in the above described manner, the interpolating points $f_1$ and $f_2$ nearest the positions $F_1$ and $F_2$ are determined.

Figure 20:
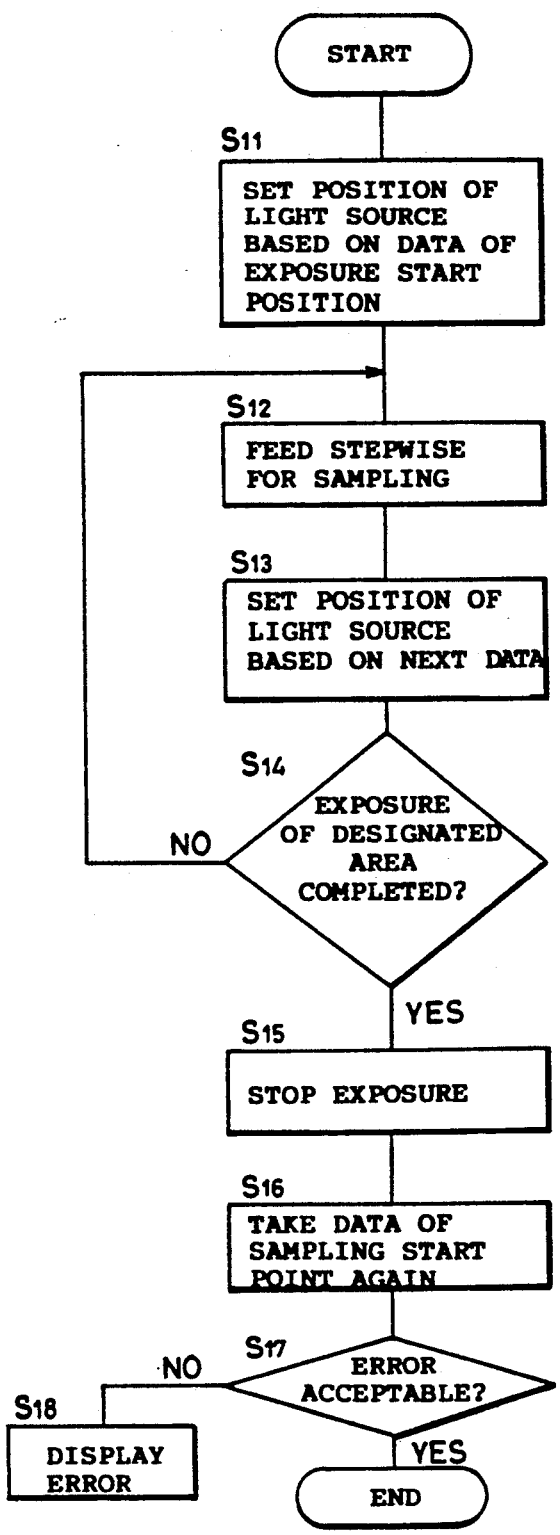

The process for exposing the periphery of the wafer W will be described with reference to the flow chart of FIG. 20.

As the wafer W is rotated once for sampling of the peripheral position data, the wafer W returns to the original setting. The light source 31 is arranged opposed to the set position of the line sensor 19 which is the reference of the $\theta$ address of the sampling point, and the peripheral position data of the sampling point having the $\theta$ address 180° is read first for the exposing process.

Since the distance $L_1$ between the reference position C of the light source 7 and the center O of the table 11 has been set in advance as shown in FIG. 17A, the light source 7 is driven for the previously set exposure width from the reference position C by the distance $L_1-L_0$. The exposure position is adjusted based on the peripheral position data of the sampling point having the $\theta$ address 180°.

(ii) Second embodiment of the wafer linear portion detecting apparatus

The second embodiment of the wafer linear portion detecting apparatus will be described in the following. The structure and the control block diagram of the periphery exposing apparatus of the second embodiment are basically the same as those shown in FIGS. 17A to 18. Therefore, the description thereof is not repeated.

Figure 27:
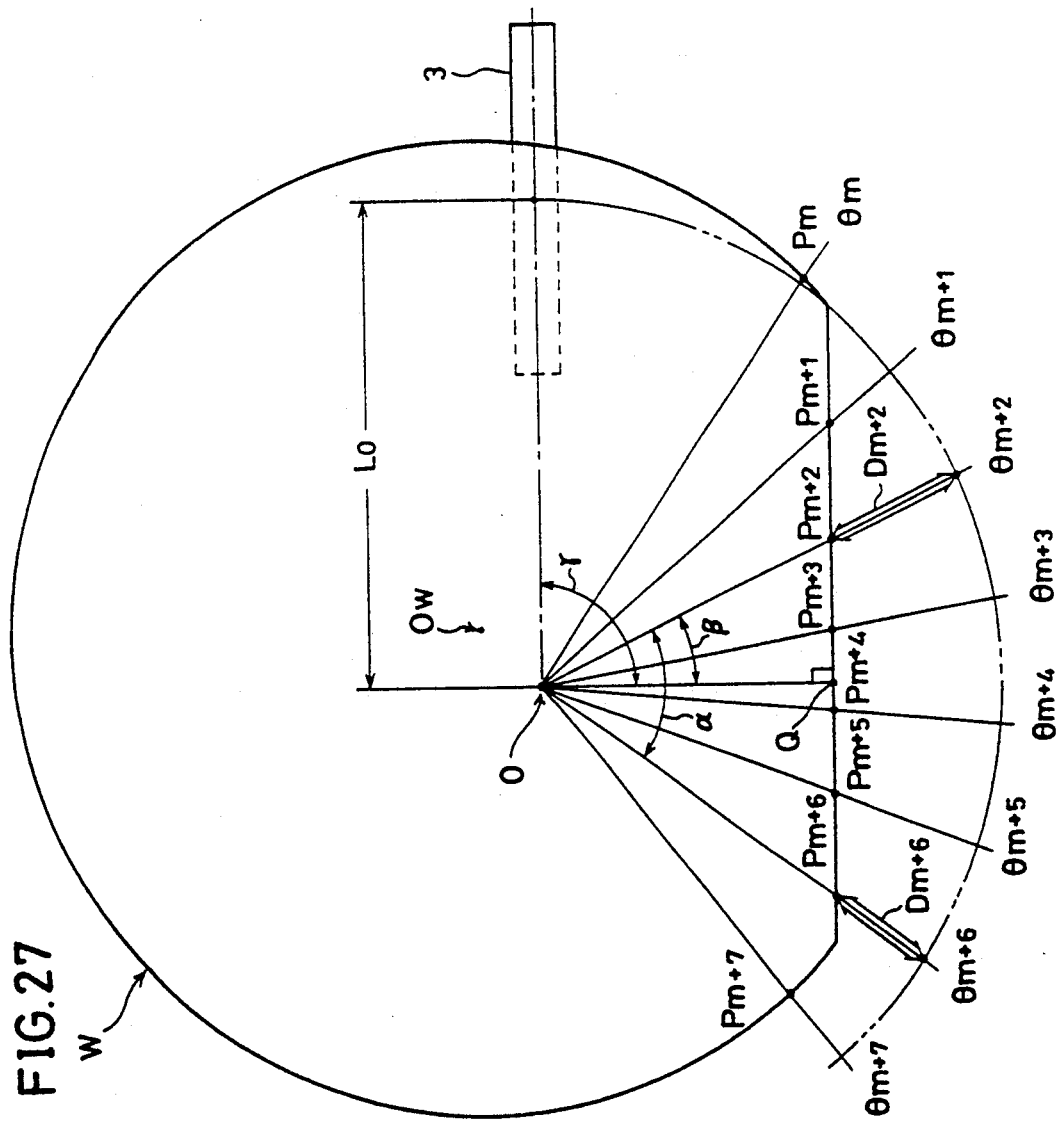
FIGS. 27 and 28 illustrate a second embodiment of the method of detecting the linear portion of the wafer in accordance with the present invention.
Figure 28:
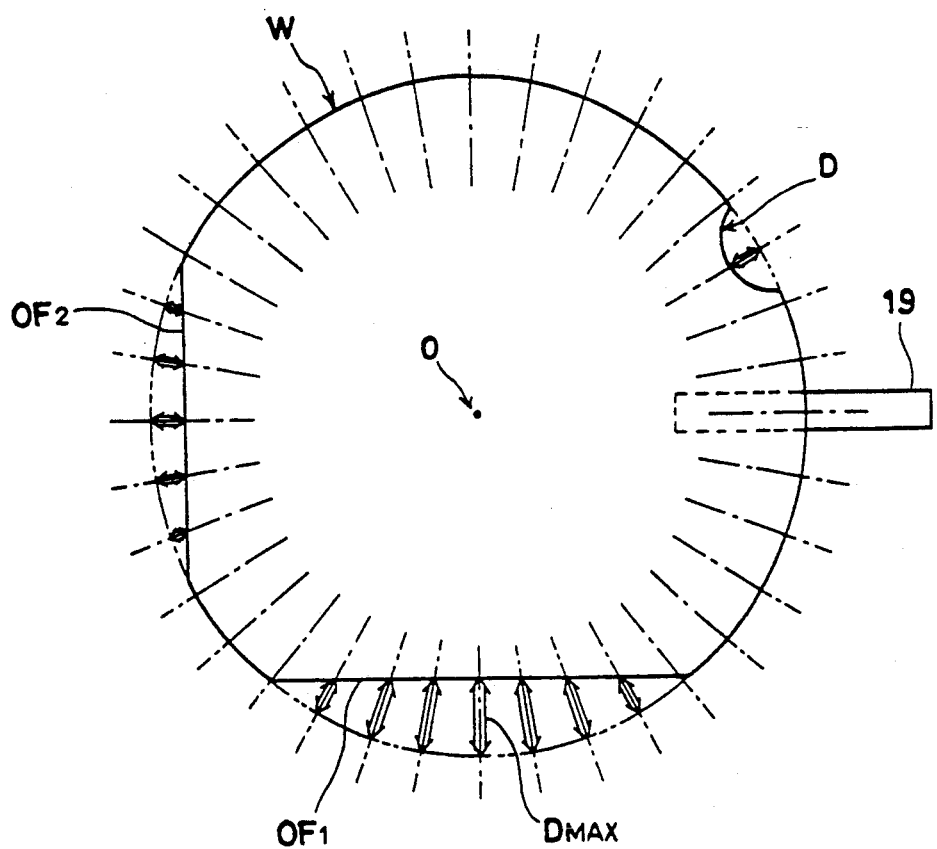

The method for detecting the linear portion Ws of the wafer will be described with reference to FIG. 27. Since FIG. 27 is similar to FIG. 26, the corresponding portions are denoted by the same reference characters, and the description thereof is not repeated.

In the second embodiment, the position of the wafer W is represented by the deviation of the perpendicular $\overline{OQ}$ extending from the center O (center of rotation) of the table to the orientation flat relative to the reference point $\theta_0$ which is the set position of the line center 19. The angle $\gamma$ of deviation of the perpendicular $\overline{OQ}$ is calculated in the following manner.

(1) A sampling point having the maximum peripheral position data is selected out of the taken peripheral position data. Since the peripheral position data becomes larger as the line sensor 19 receives light from wider range, the sampling point having the maximum peripheral position data is included in the orientation flat, unless the wafer W is placed largely off the center of the table 11. In this example, it is assumed that the sampling point $P_{m+4}$ having the $\theta$ address $\theta_{m+4}$ is detected.

(2) Sampling points sandwiching the sampling point $P_{m+4}$ on the orientation flat are appropriately selected. These are determined by selecting the sampling points spaced apart by the prescribed step angle from the $\theta$ address of the sampling point having the maximum peripheral position data. In this example, sampling points $P_{m+2}$ and $P_{m+6}$ of the addresses $\theta_{m+6}$, and $\theta_{m+2}$ which are apart by two step angles from $P_{m+4}$, are selected.

(3) When the opening angle of the $\overline{OP}_{m+2}$ and $\overline{OP}_{m+6}$ is represented by $\alpha$, the length of the perpendicular $\overline{OQ}$ is given by the following equation (1).

$$\overline{OQ} = \overline{OP}_{m+2} \cos \beta = \overline{OP}_{m+6} \cos (\alpha - \beta) \quad (1)$$

$\overline{OP}_{m+2}$ and $\overline{OP}_{m+6}$ can be readily found by subtracting the peripheral position data $D_{m+2}$ and $D_{m+6}$, respectively, of the sampling points $P_{m+2}$ and $P_{m+6}$ from the distance $L_0$ from the center of the table 0 to the central position of the line sensor 19. $\alpha$ can be given by $\theta_{m+6}-\theta_{m+2}$. $\beta$ represents the opening angle of the $\theta$ address $\theta_{+2}$ of the sampling point $P_{m+2}$ from the perpendicular $\overline{OQ}$.

The following equation (2) for calculating the opening angle $\beta$ can be provided from the above equation (1).

$$\beta = \arctan\left(\frac{\overline{OP}_{m+2}}{\overline{OP}_{m+6}} \csc \alpha - \cot \alpha\right) \quad (2)$$

When the opening angle $\beta$ of the perpendicular $\overline{OQ}$ about the $\theta$ address $\theta_{m+2}$ is calculated, the angle $\gamma$ of deviation of the perpendicular $\overline{OQ}$ about the reference point $\theta_0$ can be readily calculated in accordance with the following equation (5).

$$\gamma = \theta_{m+2} + \beta \quad (5)$$

The present position of the wafer W can be determined in the same manner as the angle $\gamma$ of deviation of the perpendicular $\overline{OQ}$ about the reference point $\theta_0$ is detected in the above described manner. The wafer W can be positioned at an arbitrary angular position on the table 11 by appropriately rotating and driving the table 11.

Although detection of the position when the wafer W is placed off center on the table 11 has been described with reference to FIG. 21, position detection can be appropriately carried out even when two or more orientation flats OF1, OF2 are provided on the wafer W or even when there is a notch D on the peripheral portion of the wafer W. More specifically, provided that the depth of the orientation flat OF2 or the depth of the notch portion D is shallower than the depth of the orientation flat OF1 serving as the reference for positioning, the sampling point having the maximum value $D_{MAX}$ out of the taken peripheral position data is surely included in the orientation flat OF1.

Although two sampling points spaced apart by 2 step angles are selected as two sampling points sandwiching the sampling point having the maximum peripheral positional data out of the peripheral position data stored in the RAM 37 in the presently described embodiment, sampling points apart by 1 step angle or 3 or more step angles may be selected.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A periphery exposing apparatus for exposing a periphery of a wafer having a linear portion, wherein resist is located on said wafer, said apparatus comprising:

supporting means for rotatably supporting said wafer;

illuminating means for emitting light to expose said periphery, said illuminating means being effective to remove said resist by illuminating said wafer;

exposure position detecting means for detecting exposure positions of the periphery of said wafer, said exposure position detecting means comprising linear portion detecting means for detecting said linear portion;

controlling means including exposure width setting means for controlling said supporting means and said illuminating means such that exposure of said periphery is carried out under prescribed exposure conditions, said exposure width setting means being effective to control said illuminating means so that said periphery of said wafer is exposed in accordance with exposure widths corresponding to said exposure positions; and means for moving said illuminating means such that said illuminating means is movable both in a generally radial direction relative to said wafer and in a generally tangential direction relative to said wafer, said controlling means being effective to control said moving means so that said illuminating means is moved substantially tangentially and relatively along said linear position when said linear portion is exposed.

2. An apparatus according to claim 1, wherein said exposure position detecting means comprises photoelectric converting means.

3. An apparatus according to claim 1, wherein said supporting means is rotatable relative to a prescribed position which serves as a reference, and said exposure position detecting means being effective for detecting the exposure position of said wafer with said prescribed position being the reference.

4. An apparatus according to claim 3, wherein said moving means is movable between a first position and a second position which is different from the first position, whereby an exposure region having a first length and an exposure region having a second length longer than said first length are formed on said wafer, a supporting portion is provided at a prescribed position on the periphery of said wafer for supporting itself, and the exposure region having said second length corresponds to said supporting portion.

5. An apparatus according to claim 4, wherein said exposure position detecting means comprises photoelectric converting means.

6. An apparatus according to claim 1, wherein the amount of light emitted from said illuminating means is constant, a speed of rotation of said supporting means is changeable, and said controlling means is effective for controlling said speed of rotation of said supporting means.

7. An apparatus according to claim 6, wherein said exposure position detecting means comprises photoelectric converting means.

8. An apparatus according to claim 1, wherein said exposure position detecting means comprises peripheral position data detecting means for detecting positional data of the entire periphery of said object, said positional data being stored in said memory means, and said moving means being effective for controlling a position of said illuminating means based on the positional data stored in said memory means.

9. An apparatus according to claim 8, wherein said peripheral position data detecting means is effective for detecting positional data of said wafer at prescribed spaces, said exposure position detecting means further comprises interpolation data forming means for generating interpolation data, and interpolating the data in the prescribed space not detected by said peripheral position detecting means.

10. An apparatus according to claim 1 wherein the illuminating means is disposed at a prescribed position opposed to said supporting means.

11. A method of exposing periphery of a wafer wherein the periphery comprises at least one linear portion and a curved portion, and resist is located on said wafer, said method comprising the steps of:

supporting said wafer on a rotatable support base;

providing a light source having a desired light intensity and disposing the same at a prescribed position relative to said support base; and providing means for moving said light source in both a generally radial and a generally tangential direction relative to said wafer and moving said light source generally along said tangential direction when said linear portion is being exposed.

12. A detecting apparatus for detecting a linear portion of a wafer having a periphery including at least a linear portion and a curved portion, including:

supporting means for supporting said wafer;

rotating means for rotating said supporting means by prescribed angles;

position detecting means disposed near said supporting means for obtaining signals representative of positional data of the periphery of said wafer relative to a center of rotation of said supporting means at said prescribed angles;

calculating means for calculating a deviation angle defined relative to a reference line comprising a normal extending from said center of rotation and intersecting said linear portion, based on the maximum value of the positional data derived from said signals, obtained by said position detecting means, and based on positional data derived from said signals of two points sandwiching said maximum value; and controlling means receiving the deviation angle for stopping the rotating means when the deviation angle equals a predescribed rotation angle.

13. An apparatus according to claim 12, wherein said position detecting means comprises a light emitting element and a light receiving element, sandwiching said wafer from upper and lower sides thereof.

14. An apparatus according to claim 13, wherein said light receiving element comprises a CCD image sensor.

15. An apparatus according to claim 14, wherein said position detecting means comprises memory means for storing said positional data.

16. The apparatus as recited in claim 12, wherein said reference point is the position at which said position detecting means is disposed, said deviation angle being determined utilizing the equation:

$$\beta = \arctan\left(\frac{\overline{OP_m}}{\overline{OP_n}} \csc \alpha - \cot \alpha \right)$$

where $\alpha$ is an opening angle of $OP_m$ and $OP_n$, and $\beta$ is an opening angle of $OP_m$ from said normal.

17. A method of detecting a linear portion of an object having a periphery comprising at least the linear portion and curved portion, comprising the steps of:

rotating said object about an axis of rotation of a support;

rotating said object by a prescribed deviation angle for detecting the position of and thereby obtaining signals representative of positional data defining the location of the periphery of said object relative to said axis of rotation;

calculating the position of said linear portion by reference to a reference line comprising a normal extending from said axis of rotation and intersecting said linear portion perpendicularly, based on finding a maximum value of said detected positional data derived from said signals for locating the position of said reference line, and based on positional data derived from said signals associated with two points sandwiching said maximum value for calculating the position of said linear portion; and calculating a reference angle from the linear portion calculation, stopping the object when the reference angle equals the prescribed deviation angle.

18. The method as recited in claim 17, wherein said reference point is the position at which said position detecting means is disposed, said deviation angle being determined utilizing the equation:

$$\beta = \arctan\left(\frac{\overline{OP_m}}{\overline{OP_n}} \csc \alpha - \cot \alpha \right)$$

where $\alpha$ is an opening angle of $OP_m$ and $OP_n$, and $\beta$ is an opening angle of $OP_m$ from said normal.

* * * * *